(12) United States Patent
Hwang et al.

(10) Patent No.: US 11,502,059 B2
(45) Date of Patent: Nov. 15, 2022

(54) SEMICONDUCTOR PACKAGE INCLUDING A THERMAL PILLAR AND HEAT TRANSFER FILM

(71) Applicant: SAMSUNG ELECTRONICS CO., LTD., Suwon-si (KR)

(72) Inventors: Heejung Hwang, Hwasung-si (KR); Jae Choon Kim, Hwasung-si (KR); Yun Seok Choi, Hwasung-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 314 days.

(21) Appl. No.: 16/724,592

(22) Filed: Dec. 23, 2019

(65) Prior Publication Data

US 2020/0335480 A1    Oct. 22, 2020

(30) Foreign Application Priority Data

Apr. 17, 2019    (KR) .................. 10-2019-0045014

(51) Int. Cl.
*H01L 25/065*    (2006.01)
*H01L 23/367*    (2006.01)

(52) U.S. Cl.
CPC ...... *H01L 25/0652* (2013.01); *H01L 23/3675* (2013.01); *H01L 2225/06513* (2013.01); *H01L 2225/06541* (2013.01); *H01L 2225/06589* (2013.01)

(58) Field of Classification Search
CPC ............. H01L 25/0632; H01L 25/0652; H01L 23/3675; H01L 23/367; H01L 2225/06589; H01L 2225/06541; H01L 2225/06513

USPC ......................................................... 257/713
See application file for complete search history.

(56) References Cited

U.S. PATENT DOCUMENTS

| 7,250,576 | B2 | 7/2007 | Colgan et al. |
| 8,922,000 | B2 | 12/2014 | Han |
| 9,076,754 | B2 | 7/2015 | Hung et al. |
| 9,142,476 | B2 | 9/2015 | Shioga et al. |
| 9,583,415 | B2 | 2/2017 | Yu et al. |
| 9,859,262 | B1 | 1/2018 | Patel et al. |
| 10,062,665 | B2 * | 8/2018 | Chen .................. H01L 23/3128 |
| 10,098,220 | B2 | 10/2018 | Liang et al. |
| 2013/0208426 | A1 * | 8/2013 | Kim ........................ H01L 23/42 361/717 |
| 2014/0168902 | A1 * | 6/2014 | Park ........................ H05K 3/30 361/719 |
| 2016/0093598 | A1 | 3/2016 | Jo et al. |
| 2017/0236804 | A1 | 8/2017 | Hembree |

(Continued)

FOREIGN PATENT DOCUMENTS

JP    5974454    8/2016
KR    10-2016-0037582    4/2016

*Primary Examiner* — Alexander O Williams
(74) *Attorney, Agent, or Firm* — F. Chau & Associates, LLC

(57) ABSTRACT

A semiconductor package includes: a first thermal pillar disposed on a package substrate, and having an opening; a first chip stack disposed on the package substrate and in the opening of the first thermal pillar, and including a first lateral surface; a semiconductor chip disposed on the package substrate and in the opening, wherein the semiconductor chip is spaced apart from the first chip stack; and a first heat transfer film disposed between the first thermal pillar and the first lateral surface of the first chip stack.

20 Claims, 21 Drawing Sheets

(56) References Cited

U.S. PATENT DOCUMENTS

| | | | |
|---|---|---|---|
| 2017/0374759 A1 | 12/2017 | Hoffmeyer et al. | |
| 2018/0348434 A1 | 12/2018 | Yim | |
| 2018/0350712 A1 | 12/2018 | Thanu et al. | |
| 2018/0350754 A1 | 12/2018 | Huang et al. | |
| 2018/0350755 A1 | 12/2018 | Huang et al. | |
| 2019/0198489 A1* | 6/2019 | Kim | H01L 25/18 |
| 2019/0323785 A1* | 10/2019 | Eid | H01L 25/0655 |
| 2019/0326192 A1* | 10/2019 | Eid | H01L 24/16 |
| 2019/0385929 A1* | 12/2019 | Ku | H01L 24/24 |
| 2019/0393192 A1* | 12/2019 | Eid | H01L 25/50 |
| 2020/0185300 A1* | 6/2020 | Xu | H01L 23/053 |
| 2021/0043573 A1* | 2/2021 | Eid | H01L 23/4334 |
| 2021/0235596 A1* | 7/2021 | Uppal | H01L 23/3675 |
| 2021/0249322 A1* | 8/2021 | Lin | H01L 23/562 |

\* cited by examiner

SEMICONDUCTOR PACKAGE INCLUDING A THERMAL PILLAR AND HEAT TRANSFER FILM

CROSS-REFERENCE TO RELATED APPLICATION

This U.S. nonprovisional application claims priority under 35 U.S.C. § 119 to Korean Patent Application No. 10-2019-0045014 filed on Apr. 17, 2019 in the Korean Intellectual Property Office, the disclosure of which is incorporated by reference herein in its entirety.

TECHNICAL FIELD

The present inventive concept relates to a semiconductor package, and more particularly, to a semiconductor package including a thermal pillar and heat transfer film.

DISCUSSION OF THE RELATED ART

As performance and speed of electronic products have increased, thermal energy produced from semiconductor devices of the electronic products have increased too. To reduce the amount of heat generated from the semiconductor devices of the electronic products, methods of limiting the performance of the electronic products are being used when the temperature of the electronic products reaches a specific point. However, as the thermal energy increases, the temperature of semiconductor devices rapidly rises such that the performance of the semiconductor devices degrade, and accordingly, the semiconductor devices decrease in efficiency.

SUMMARY

According to an exemplary embodiment of the present inventive concept, a semiconductor package includes: a first thermal pillar disposed on a package substrate, and having an opening; a first chip stack disposed on the package substrate and in the opening of the first thermal pillar, and including a first lateral surface; a semiconductor chip disposed on the package substrate and in the opening, wherein the semiconductor chip is spaced apart from the first chip stack; and a first heat transfer film disposed between the first thermal pillar and the first lateral surface of the first chip stack.

According to an exemplary embodiment of the present inventive concept, a semiconductor package includes: a first chip stack disposed on a package substrate, and including a first lateral surface and a second lateral surface; a semiconductor chip disposed on the package substrate and spaced apart from the first chip stack, wherein the semiconductor chip includes a third lateral surface and a fourth lateral surface; a first thermal pillar disposed on the first lateral surface of the first chip stack; a first heat transfer film disposed between the first thermal pillar and the first lateral surface of the first chip stack; a second thermal pillar disposed on the third lateral surface of the semiconductor chip; and a second heat transfer film disposed between the second thermal pillar and the third lateral surface of the semiconductor chip, wherein the second lateral surface of the first chip stack and the fourth lateral surface of the semiconductor chip are exposed by the first and second heat transfer films.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawing, wherein.

DETAILED DESCRIPTION OF EMBODIMENTS

Figure 1:
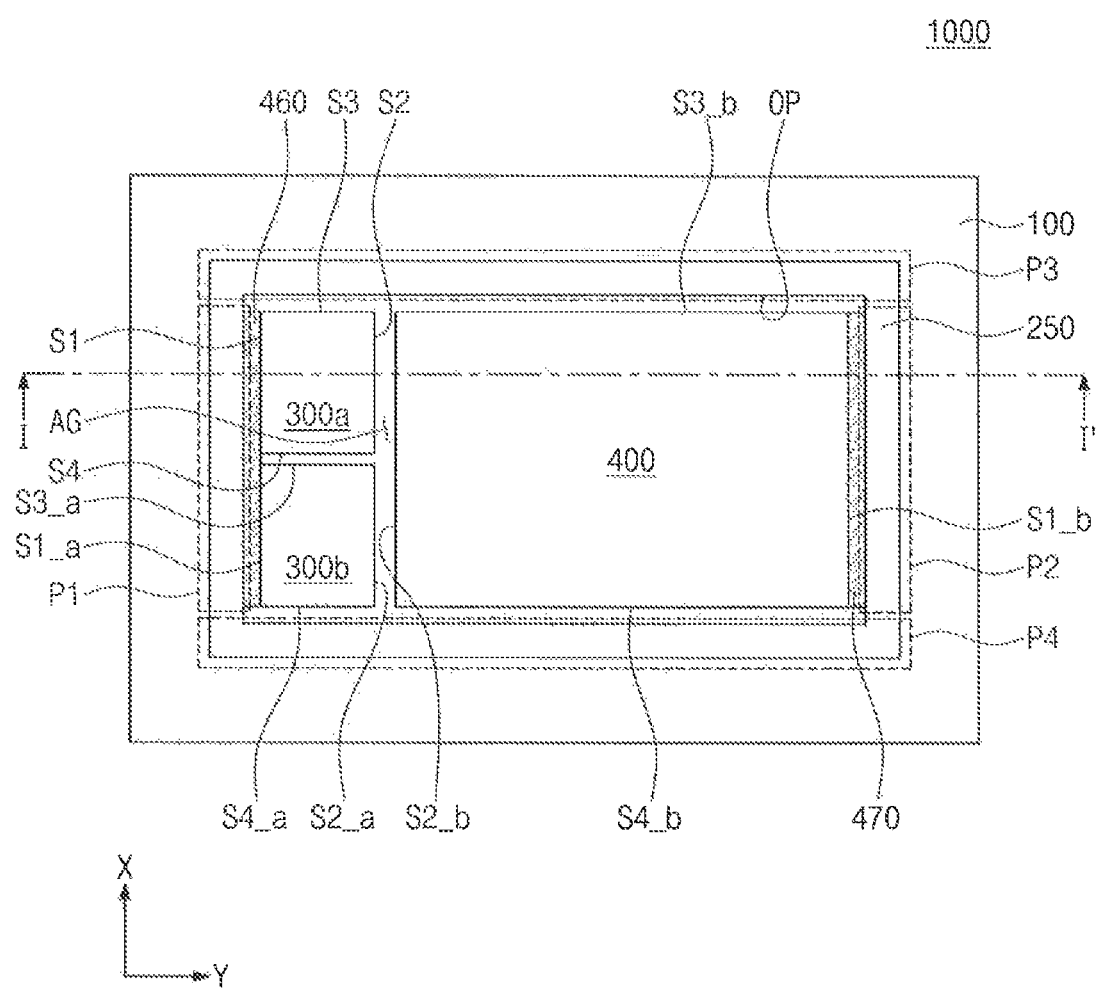
FIG. 1 is a plan view showing a semiconductor package according to an exemplary embodiment of the present inventive concept.
Figure 2:
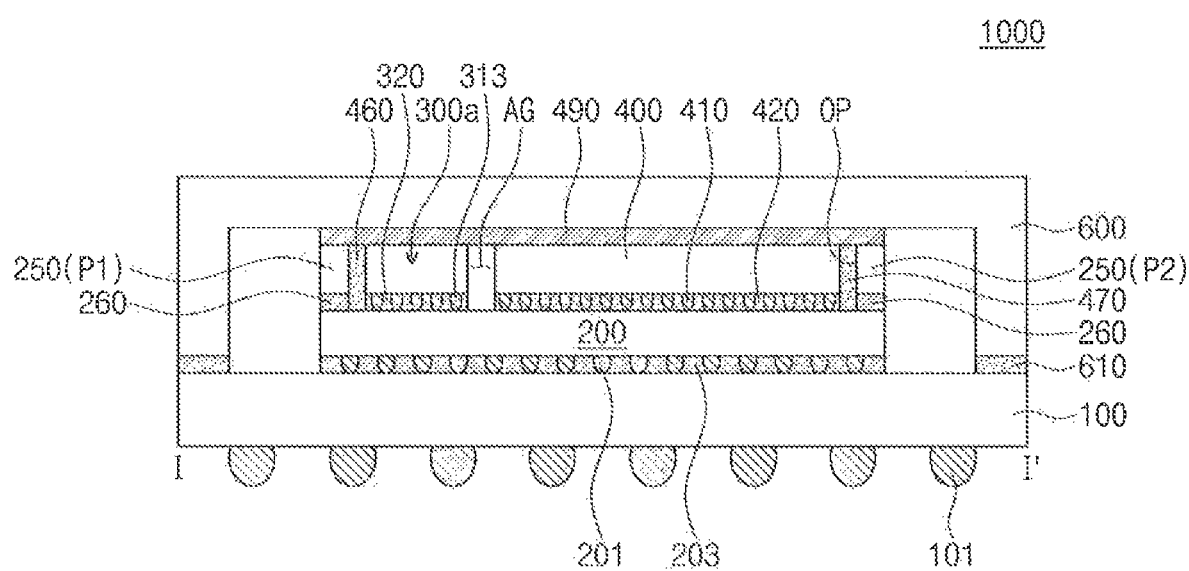
FIG. 2 is a cross-sectional view taken along line I-I' of FIG. 1, showing a semiconductor package according to an exemplary embodiment of the present inventive concept.
Figure 3:
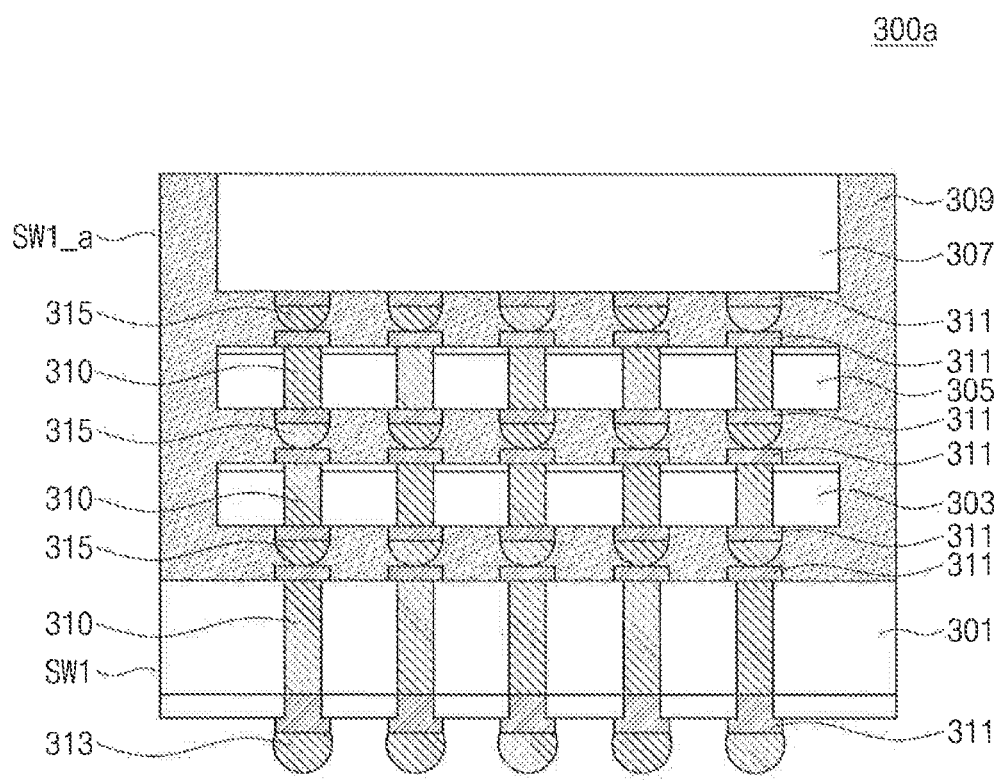
FIG. 3 is an enlarged cross-sectional view showing a first chip stack of FIG. 2.

FIG. 1 is a plan view showing a semiconductor package according to an exemplary embodiment of the present inventive concept. FIG. 2 is a cross-sectional view taken along line I-I' of FIG. 1, showing a semiconductor package according to an exemplary embodiment of the present inventive concept. FIG. 3 is an enlarged cross-sectional view showing a first chip stack of FIG. 2.

Referring to FIGS. 1 and 2, a semiconductor package 1000 may include a package substrate 100, an interposer substrate 200, first and second chip stacks 300a and 300b, a semiconductor chip 400, a thermal pillar 250, and first and second heat transfer films 460 and 470.

The interposer substrate 200 may be disposed on the package substrate 100. For example, the interposer substrate 200 may disposed on a top surface of the package substrate 100. The package substrate 100 may include a plurality of stacked dielectric layers and inner wiring lines between the dielectric layers. The package substrate 100 may be, for example, a printed circuit board (PCB). External terminals 101 may be disposed on a bottom surface of the package substrate 100, which bottom surface is opposite to the top surface of the package substrate 100. The external terminals 101 may be electrically connected to the inner wiring lines in the package substrate 100. The external terminals 101 may include, for example, a solder ball. For example, the external terminals 101 may include of tin (Sn), lead (Pb), nickel (Ni), gold (Au), silver (Ag), copper (Cu), and; or bismuth (Bi).

The interposer substrate 200 may have a structure in which dielectric layers and metal lines are alternately stacked. The interposer substrate 200 may serve to electrically connect the package substrate 100 and the first chip stack 300a to each other, the packages substrate 100 and the second chip stack 300b to each other, and the package substrate 100 and the semiconductor chip 400 to each other. First terminals 201 may be disposed on a bottom surface of the interposer substrate 200. The first terminals 201 may be placed between the top surface of the package substrate 100 and the bottom surface of the interposer substrate 200. The first terminals 201 may electrically connect the package substrate 100 and the interposer substrate 200 to each other. The first terminals 201 may include tin (Sn), lead (Pb), nickel (Ni), gold (Au), silver (Ag), copper (Cu), and/or bismuth (Bi).

A first under-fill resin layer 203 may be disposed in a space between the package substrate 100 and the interposer substrate 200. The first under-fill resin layer 203 may cover the first terminals 201. The first under-fill resin layer 203 may serve to fix the interposer substrate 200 on the package substrate 100 and/or to protect the first terminals 201. The first under-fill resin layer 203 may include, for example, epoxy-based resin, benzocyclobutene, or polyimide. The first under-fill resin layer 203 may further include silica fillers. In an exemplary embodiment of the present inventive concept, the first under-fill resin layer 203 may include adhesive and flux. The flux may include an oxide film remover. In an exemplary embodiment of the present inventive concept, the first under-fill resin layer 203 may include silica fillers or flux. In an exemplary embodiment of the present inventive concept, the first under-fill resin layer 203 may include non-conductive paste.

The thermal pillar 250 may be disposed on a top surface of the interposer substrate 200. For example, the thermal pillar 250 may be directly disposed on the top surface of the interposer substrate 200. The thermal pillar 250 may have an opening OP. The thermal pillar 250 may be placed on an edge of the interposer substrate 200. The opening OP may partially expose the top surface of the interposer substrate 200. For example, the thermal pillar 250 may have outer surfaces aligned with lateral surfaces of the interposer substrate 200. For example, the outer lateral surfaces of the thermal pillar 250 may be coplanar with the lateral surfaces of the interposer substrate 200. The thermal pillar 250 may have inner surfaces spaced apart from the lateral surfaces of the interposer substrate 200. The thermal pillar 250 may include a first part P1 and a second part P2 that face each other and are parallel to a first direction X, and also include a third part P3 and a fourth part P4 that face each other and are parallel to a second direction Y intersecting the first direction X. The thermal pillar 250 may include, for example, a silicon material or a high-k dielectric material. The high-k dielectric material may include, for example, $HfO_2$, $Al_2O_3$, $HfAlO_3$, $Ta_2O_3$, and/or $TiO_2$. A thermal interface material layer 260 may be disposed between a bottom surface of the thermal pillar 250 and the top surface of the interposer substrate 200. The thermal interface material layer 260 may fix the thermal pillar 250 on the top surface of the interposer substrate 200. The thermal interface material layer 260 may thermally connect the thermal pillar 250 to the interposer substrate 200. The thermal interface material layer 260 may be interposed between the interposer substrate 200 and the thermal pillar 250, while extending along the thermal pillar 250. The thermal interface material layer 260 may include, for example, thermal grease, epoxy materials, or solid particles of metal such as indium. The thermal interface material layer 260 may maintain a solid state at low temperatures, but may be converted from its solid state into a liquid state at high temperatures. The thermal interface material layer 260 may have adhesiveness and/or conductivity.

In an exemplary embodiment of the present inventive concept, the thermal interface material layer 260 may be omitted. In this case, the bottom surface of the thermal pillar 250 may directly contact the top surface of the interposer substrate 200.

The first chip stack 300a and the second chip stack 300b may be disposed on the interposer substrate 200. The first and second chip stacks 300a and 300b may be placed on the top surface of the interposer substrate 200 in the opening OP of the thermal pillar 250. The first and second chip stacks 300a and 300b may be spaced apart from each other in the first direction X on the top surface of the interposer substrate 200. The first and second chip stacks 300a and 300b may have their top surfaces coplanar with that of the thermal pillar 250. For example, each of the first and second chip stacks 300a and 300b may be a high bandwidth memory (HBM).

The first chip stack 300a may have a first lateral surface S1, a second lateral surface S2, a third lateral surface S3, and a fourth lateral surface S4. The first lateral surface S1 and the second lateral surface S2 may be parallel to the first direction X and may face each other. The first lateral surface S1 may be closer than the second lateral surface S2 to the thermal pillar 250 extending in the first direction X, and the second lateral surface S2 may be closer than the first lateral surface S1 to the semiconductor chip 400. The third lateral surface S3 and the fourth lateral surface S4 may be parallel to the second direction Y and may face each other. The third lateral surface S3 may be closer than the fourth lateral surface S4 to the thermal pillar 250 extending in the second direction Y, and the fourth lateral surface S4 may be closer than the third lateral surface S3 to the second chip stack 300b. The first lateral surface S1 of the first chip stack 300a may be spaced apart from the thermal pillar 250. For example, the first lateral surface S1 of the first chip stack 300a may be spaced apart from the first part P1 of the thermal pillar 250. The third lateral surface S3 of the first chip stack 300a may be spaced apart from the thermal pillar 250. For example, the third lateral surface S3 of the first chip stack 300a may be spaced apart from the third part P3 of the thermal pillar 250.

The second chip stack 300b may have a first lateral surface S1_a, a second lateral surface S2_a, a third lateral surface S3_a, and a fourth lateral surface S4_a. The first lateral surface S1_a and the second lateral surface S2_a may be parallel to the first direction X and may face each other. The first lateral surface S1_a may be closer than the second lateral surface S2_a to the thermal pillar 250 extending in the first direction X, and the second lateral surface S2_a may be closer than the first lateral surface S1_a to the semiconductor chip 400. The third lateral surface S3_a and the fourth lateral surface S4_a may be parallel to the second direction Y and may face each other. The third lateral surface S3_a may be closer than the fourth lateral surface S4_a to the first chip stack 300a, and the fourth lateral surface S4_a may be closer than the third lateral surface to the thermal pillar 250 extending in the second direction Y. The first lateral surface S1_a of the second chip stack 300b may be spaced apart from the thermal pillar 250. For example, the first lateral surface S1_a of the second chip stack 300b may be spaced apart from the first part P1 of the thermal pillar 250. The fourth lateral surface S4_a of the second chip stack 300b may be spaced apart from the thermal pillar 250. For example, the fourth lateral surface S4_a of the second chip stack 300b may be spaced apart from the fourth part P4 of the thermal pillar 250.

Referring further to FIG. 3, each of the first and second chip stacks 300a and 300b may include a first chip 301, a second chip 303, a third chip 305, a fourth chip 307, and a chip molding layer 309. The second chip 303 may be stacked on the first chip 301, the third chip 305 may be stacked on the second chip 303, and the fourth chip 307 may be stacked on the third chip 305. For example, the second chip 303, the third chip 305, and the fourth chip 307 may be sequentially stacked on a top surface of the first chip 301. For example, the first chip 301 may be a semiconductor logic chip, and the second, third, and fourth chips 303, 305, and 307 may be semiconductor memory chips. The first chip 301 may have a width greater than those of the second, third, and fourth chips 303, 305, and 307.

Through vias 310 may be disposed in the first, second, and third chips 301, 303, and 305. The through vias 310 may penetrate the first, second, and third chips 301, 303, and 305. The through vias 310 might not be provided in the fourth chip 307. The through vias 310 may include a metallic material (e.g., copper, tungsten, or aluminum). Chip pads 311 may be disposed on top and bottom surfaces of the first chip 301, on top and bottom surfaces of the second chip 303, on top and bottom surfaces of the third chip 305, and on a bottom surface of the fourth chip 307. The chip pads 311 on the top and bottom surfaces of the first chip 301 may be placed on top and bottom surfaces of the through vias 310 which penetrate the first chip 301. The chip pads 311 on the top and bottom surfaces of the second chip 303 may be placed on top and bottom surfaces of the through vias 310 which penetrate the second chip 303. The chip pads 311 on the top and bottom surfaces of the third chip 305 may be placed on top and bottom surfaces of the through vias 310 which penetrate the third chip 305. The chip pads 311 on the bottom surface of the fourth chip 307 may be placed to correspond to the chip pads 311 on the top surface of the third chip 305. For example, the chip pads 311 may include a metallic material copper, tungsten, or aluminum).

Second terminals 313 may be disposed on the chip pads 311 disposed on the bottom surface of the first chip 301. As shown in FIG. 2, the second terminals 313 may be disposed on the top surface of the interposer substrate 200. Third terminals 315 may be disposed between the first chip 301 and the second chip 303, between the second chip 303 and the third chip 305, and between the third chip 305 and the fourth chip 307. For example, the third terminals 315 may be placed between the chip pads 311 disposed on the top surface of the first chip 301 and the chip pads 311 disposed on the bottom surface of the second chip 303. The third terminals 315 may be disposed between the chip pads 311 disposed on the top surface of the second chip 303 and the chip pads 311 disposed on the bottom surface of the third chip 305. In addition, the third terminals 315 may be disposed between the chip pads 311 disposed on the top surface of the third chip 305 and the chip pads 311 disposed on the bottom surface of the fourth chip 307. The second and third terminals 313 and 315 may include tin (Sn), lead (Pb), nickel (Ni), gold (Au), silver (Ag), copper (Cu), and/or bismuth (Bi).

The chip molding layer 309 may be disposed on the top surface of the first chip 301. On the top surface of the first chip 301, the chip molding layer 309 may cover the second, third, and fourth chips 303, 305, and 307. The chip molding layer 309 may fill a space between the first chip 301 and the second chip 303, a space between the second chip 303 and the third chip 305, and a space between third chip 305 and the fourth chip 307. The chip molding layer 309 may have a width substantially the same as that of the first chip 301. The chip molding layer 309 may include an epoxy molding compound (EMC).

Referring to FIGS. 2 and 3, a second under-fill resin layer 320 may be disposed in a space between the first chip stack 300a and the interposer substrate 200. For example, the second under-fill resin layer 320 may be positioned in a space between the bottom surface of the first chip 301 of the first chip stack 300a and the top surface of the interposer substrate 200. The second under-fill resin layer 320 may cover the second terminals 313. The second under-fill resin layer 320 may serve to fix the first chip stack 300a on the interposer substrate 200 and/or to protect the second terminals 313. The second under-fill resin layer 320 may also be disposed in a space between the second chip stack 300b and the interposer substrate 200. For example, the second under-fill resin layer 320 may include epoxy-based resin, benzocyclobutene, or polyimide. The second under-fill resin layer 320 may further include silica fillers. In an exemplary embodiment of the present inventive concept, the second under-fill resin layer 320 may include adhesive and flux. The flux may include an oxide film remover. In an exemplary embodiment of the present inventive concept, the second under-fill resin layer 320 may include silica fillers or flux. In an exemplary embodiment of the present inventive concept, the second under-fill resin layer 320 may include nonconductive paste.

The semiconductor chip 400 may be disposed on the top surface of the interposer substrate 200. The semiconductor chip 400 may be placed on the top surface of the interposer substrate 200 in the opening OP of the thermal pillar 250. On the top surface of the interposer substrate 200, the semiconductor chip 400 may be spaced apart in the second direction Y from the first and second chip stacks 300a and 300b. The semiconductor chip 400 may have a planar area greater than those of the first and second chip stacks 300a and 300b. The semiconductor chip 400 may have a top surface substantially coplanar with that of the thermal pillar 250. The semiconductor chip 400 may be an LSI (large scale integration), a logic circuit, an image sensor such as CIS (CMOS image sensor), a MEMS (microelectromechanical system) device, an ASIC (application specific integrated circuit) device, and/or a memory device such as Flash memory, DRAM, SRAM, EEPROM, PRAM, MRAM, ReRAM, LIBM (high bandwidth memory), and/or HMC (hybrid memory cubic).

The semiconductor chip 400 may have a first lateral surface S1_b, a second lateral surface S2_b a third lateral surface S3_b, and a fourth lateral surface S4_b. The first lateral surface S1_b and the second lateral surface S2_b may extend in the first direction X and may face each other. The first lateral surface S1_b may be closer than the second lateral surface S2_b to the thermal pillar 250 extending in the first direction X, and the second lateral surface S2_b may be closer than the first lateral surface S1_b to the first and second chip stacks 300a and 300b. The third lateral surface S3_b and the fourth lateral surface S4_b may extend in the second direction Y and may face each other. The third lateral surface S3_b may be adjacent to the third part P3 of the thermal pillar 250, and the fourth lateral surface S4_b may be adjacent to the fourth part P4 of the thermal pillar 250. The first lateral surface S1_b of the semiconductor chip 400 may be spaced apart from the first part P1 of the thermal pillar 250. The third lateral surface S3_b of the semiconductor chip 400 may be spaced apart from the third part P3 of the thermal pillar 250. The fourth lateral surface S4_b of the semiconductor chip 400 may be spaced apart from the fourth part P4 of the thermal pillar 250.

Fourth terminals 410 may be disposed between the semiconductor chip 400 and the interposer substrate 200. For example, the fourth terminals 410 may be placed between a bottom surface of the semiconductor chip 400 and the top surface of the interposer substrate 200. The fourth terminals 410 may include, for example, tin (Sn), lead (Pb), nickel (Ni), gold (Au), silver (Ag), copper (Cu), and/or bismuth (Bi). A third under-fill resin layer 420 may be disposed between the semiconductor chip 400 and the interposer substrate 200. For example, the third under-fill resin layer 420 may be placed in a space between the bottom surface of the semiconductor chip 400 and the top surface of the interposer substrate 200. The third under-fill resin layer 420 may serve to fix the semiconductor chip 400 on the interposer substrate 200 and/or to protect the fourth terminals 410. For example, third under-fill resin layer 420 may include epoxy-based resin, benzocyclobutene, or polyimide. The third under-fill resin layer 420 may further include silica fillers. In an exemplary embodiment of the present inventive concept, the third under-fill resin layer 420 may include adhesive and flux. The flux may include an oxide film remover. In an exemplary embodiment of the present inventive concept, the third under-fill resin layer 420 may include silica fillers or flux. In an exemplary embodiment of the present inventive concept, the third under-fill resin layer 420 may include non-conductive paste.

The first heat transfer film 460 may be interposed between the thermal pillar 250 and the first chip stack 300a. For example, the first heat transfer film 460 may be interposed between the first part P1 of the thermal pillar 250 and the first lateral surface S1 of the first chip stack 300a. Referring further to FIG. 3, the first lateral surface S1 of the first chip stack 300a may correspond to a first lateral surface SW1 of the first chip 301 and to a first lateral surface SW1_a of the chip molding layer 309, and the first lateral surfaces SW1 and SW1_a are aligned with each other. For example, the first lateral surface SW1 of the first chip 301 and the first lateral surface SW1_a of the chip molding layer 309 are coplanar. The first heat transfer film 460 may be interposed between a lateral surface of the second under-fill resin layer 320 and the thermal interface material layer 260 which is disposed below the first part P1 of the thermal pillar 250, and a lateral surface of the second underfill resin 320 is aligned with the first lateral surface S1 of the first chip stack 300a. The first heat transfer film 460 may intermediately extend between the first part P1 of the thermal pillar 250 and the second chip stack 300b. For example, the first heat transfer film 460 may intermediately extend between the first part P1 of the thermal pillar 250 and the first lateral surface S1_a of the second chip stack 300b. The first heat transfer film 460 may contact the top surface of the interposer substrate 200. The first heat transfer film 460 might not be interposed in a space between the first and second chip stacks 300a and 300b adjacent to each other. For example, the first heat transfer film 460 might not be disposed in a space between the fourth lateral surface S4 of the first chip stack 300a and the third lateral surface S3_a of the second chip stack 300b. In this case, the first heat transfer film 460 may expose the fourth lateral surface S4 of the first chip stack 300a and the third lateral surface S3_a of the second chip stack 300b. The first heat transfer film 460 may be interposed neither in a space between the first chip stack 300a and the semiconductor chip 400 nor in a space between the second chip stack 300b and the semiconductor chip 400. Therefore, the first heat transfer film 460 may expose the second lateral surface S2 of the first chip stack 300a and the second lateral surface S2_a of the second chip stack 300b. The first heat transfer film 460 may fix the thermal pillar 250 on the first lateral surfaces S1 and S1_a of the first and second chip stacks 300a and 300b. The first heat transfer film 460 may thermally couple the thermal pillar 250 and the first chip stack 300a to each other and also thermally couple the thermal pillar 250 and the second chip stack 300b to each other. For example, first heat transfer film 460 may include a material whose thermal conductivity is greater than that of air. The first heat transfer film 460 may include, for example, thermal grease, epoxy materials, or solid particles of metal such as indium. The first heat transfer film 460 may have adhesiveness and/or conductivity.

The second heat transfer film 470 may be interposed between the thermal pillar 250 and the semiconductor chip 400. For example, the second heat transfer film 470 may be interposed and may extend between the second part P2 of the thermal pillar 250 and the first lateral surface S1_b of the semiconductor chip 400. The second heat transfer film 470 may be interposed between a lateral surface of the third under-fill resin layer 420 and the thermal interface material layer 260 which is disposed below the second part P2 of the thermal pillar 250, and the lateral surface of the third underfill resin 420 is aligned with the first lateral surface S1_b of the semiconductor chip 400. The second heat transfer film 470 may be disposed on the interposer substrate 200. For example, the second heat transfer film 470 may contact the top surface of the interposer substrate 200. The second heat transfer film 470 may be interposed in a space between the third lateral surface S3_b of the semiconductor chip 400 and the third part P3 of the thermal pillar 250 nor in a space between the fourth lateral surface S4_b of the semiconductor chip 400 and the fourth part P4 of the thermal pillar 250. In this case, the second heat transfer film 470 may expose the third and fourth lateral surfaces S3_b and S4_b of the semiconductor chip 400. The second heat transfer film 470 may be interposed neither in a space between the first chip stack 300a and the semiconductor chip 400 nor in a space between the second chip stack 300b and the semiconductor chip 400. In this case, the second heat transfer film 470 may expose the second lateral surface S2_b of the semiconductor chip 400. Therefore, no material might be provided in a space between the first chip stack 300a and the semiconductor chip 400 and in a space between the second chip stack 300b and the semiconductor chip 400. The second heat transfer film 470 may fix the thermal pillar 250 on the first lateral surface S1_b of the semiconductor chip 400. For example, second heat transfer film 470 may include a material whose thermal conductivity is greater than that of air. The second heat transfer film 470 may include, for example, thermal grease, epoxy materials, or solid particles of metal such as indium. The second heat transfer film 470 may have adhesiveness and/or conductivity.

An upper thermal interface material layer 490 may be disposed on the top surfaces of the first and second chip stacks 300a and 300b and on the top surface of the semiconductor chip 400. The upper thermal interface material layer 490 may cover the top surface of the thermal pillar 250, top surfaces of the first and second heat transfer films 460 and 470, the top surfaces of the first and second chip stacks 300a and 300b, and the top surface of the semiconductor chip 400. For example, the upper thermal interface material layer 490 may include thermal grease, epoxy materials, or solid particles of metal such as indium. The upper thermal interface material layer 490 may maintain a solid state at low temperatures, but may be converted from its solid state into a liquid state at high temperatures. The upper thermal interface material layer 490 may have adhesiveness and/or conductivity.

An air gap AG covered with the upper thermal interface material layer 490 may be provided between the first and second chip stacks 300a and 300b, between the first chip stack 300a and the semiconductor chip 400, and between the second chip stack 300b and the semiconductor chip 400. The air gap AG may be filled with air. Because the air gap AG is provided between the first and second chip stacks 300a and 300b and between the semiconductor chip 400 and each of the first and second chip stacks 300a and 300b, heat generated from a certain chip to neighboring chips may be minimized or prevented.

A heat slug 600 may be disposed on the upper thermal interface material layer 490. The heat slug 600 may cover a top surface of the upper thermal interface material layer 490. End portions of the heat slug 600 may be disposed on an edge of the package substrate 100. For example, the end portions of the heat slug 600 may be disposed on the top surface of the package substrate 100. For example, the heat slug 600 may have a "U" shape, and may be disposed to cover the interposer substrate 200, the first and second chip stacks 300a and 300b, the semiconductor chip 400, and the thermal pillar 250. An adhesive film 610 may be interposed between the package substrate 100 and the end portions of the heat slug 600. The adhesive film 610 may include, for example, an adhesive conductive material. In an exemplary embodiment of the present inventive concept, the heat slug 600 may be connected to the package substrate 100. For example, the heat slug 600 may be electrically connected to a ground layer disposed in the package substrate 100, and thus may be electrically grounded. The heat slug 600 may include, for example, a metallic material. Heat generated from the first and second chip stacks 300a and 300b and from the semiconductor chip 400 may be radiated through the upper thermal interface material layer 490 to the heat slug 600.

According to an exemplary embodiment of the present inventive concept, the thermal pillar 250 may be disposed on lateral surfaces of the semiconductor chip 400 and the first and second chip stacks 300a and 300b, and the first and second chip stacks 300a and 300b may be thermally coupled to the thermal pillar 250. Heat generated from the first and second chip stacks 300a and 300b and from the semiconductor chip 400 may not only be radiated to the heat slug 600 through the upper thermal interface material layer 490, but may be radiated to the thermal pillar 250 through the first and second heat transfer films 460 and 470. Heat transferred to the thermal pillar 250 may be discharged through the upper thermal interface material layer 490 and the interposer substrate 200. Accordingly, various transfer paths may be provided to successfully radiate heat generated from the first and second chip stacks 300a and 300b and from the semiconductor chip 400 such that degradation of the first and second chip stacks 300a and 300b and the semiconductor chip 400 may be prevented and reliability of the semiconductor package 1000 may increase.

Figure 4:
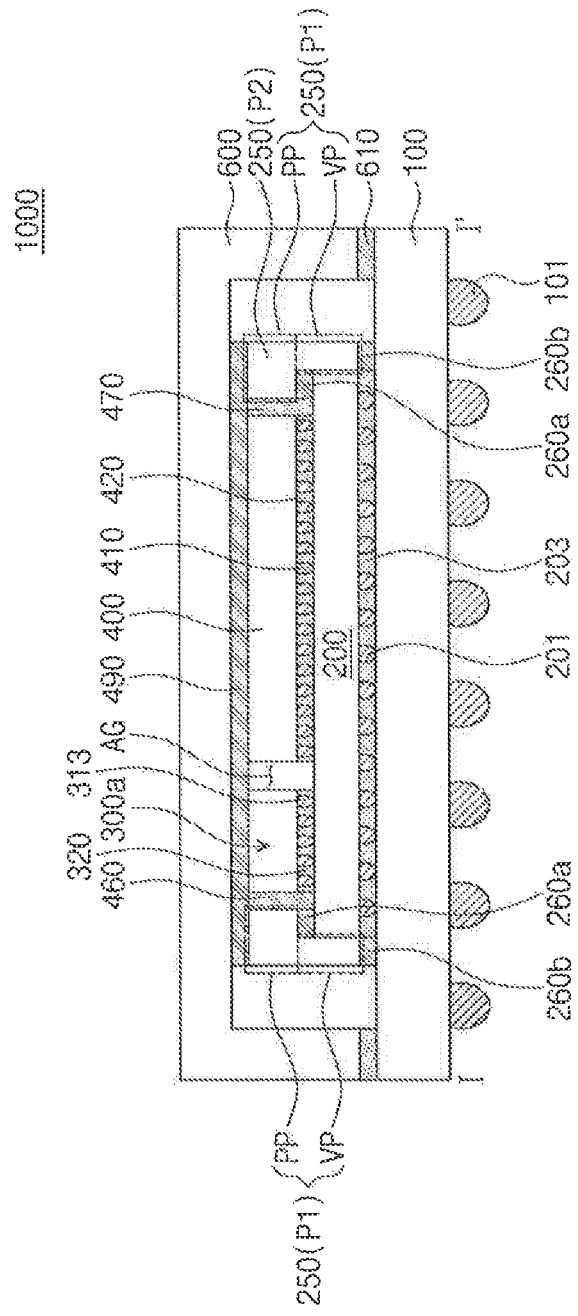
FIG. 4 is a cross-sectional view taken along line I-I' of FIG. 1, showing a semiconductor package according to an exemplary embodiment of the present inventive concept.

FIG. 4 is a cross-sectional view taken along line I-I' of FIG. 1, showing a semiconductor package according to an exemplary embodiment of the present inventive concept.

Referring to FIG. 4, the thermal pillar 250 may be disposed on the top and lateral surfaces of the interposer substrate 200 and on the top surface of the package substrate 100. For example, each of the first, second, third, and fourth parts P1, P2, P3, and P4 of the thermal pillar 250 may include a horizontal segment PP and a vertical segment VP. The horizontal segment PP may be disposed on the top surface of the interposer substrate 200. The horizontal segment PP may be parallel to the top surface of the package substrate 100. A first thermal interface material layer 260a may be interposed between the horizontal segment PP and the top surface of the interposer substrate 200. For example, the first thermal interface material layer 260a may contact the top surface of the interposer substrate 200. The vertical segment VP may extend from an end portion of the horizontal segment PP, and may be disposed on the package substrate 100. For example, the vertical segment VP may be disposed on the top surface of the package substrate 100. The vertical segment VP may contact the lateral surface of the interposer substrate 200. A second thermal interface material layer 260b may be interposed between the vertical segment VP and the package substrate 100. The second thermal interface material layer 260b may contact the package substrate 100 and a lateral surface of the first under-fill resin layer 203. For example, the second thermal interface material layer 260b may contact the top surface of the package substrate 100. The thermal pillar 250 may surround the lateral surfaces of the interposer substrate 200 and the lateral surfaces of the first under-fill resin layer 203. The thermal pillar 250 may have, for example, an inverted L shape.

Figure 5:
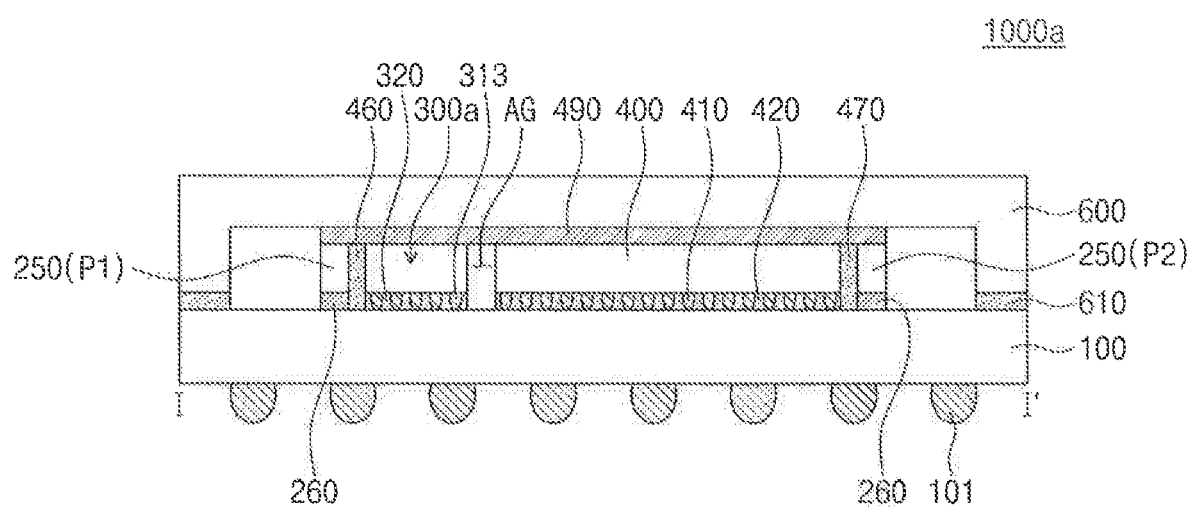
FIG. 5 is a cross-sectional view taken along line I-I' of FIG. 1, showing a semiconductor package according to an exemplary embodiment of the present inventive concept.

FIG. 5 is a cross-sectional view taken along line I-I' of FIG. 1, showing a semiconductor package according to an exemplary embodiment of the present inventive concept.

Referring to FIG. 5, a semiconductor package 1000a may include the package substrate 100, the first and second chip stacks 300a and 300b, the semiconductor chip 400, the thermal pillar 250, and the first and second heat transfer films 460 and 470.

The thermal pillar 250 may be disposed on the package substrate 100. For example, the thermal pillar may be disposed on the top surface of the package substrate 100. The thermal interface material layer 260 may be interposed between the thermal pillar 250 and the package substrate 100. For example, the thermal interface material layer 260 may be interposed between the bottom surface of the thermal pillar 250 and the top surface of the package substrate 100. The thermal interface material layer 260 may contact the top surface of the package substrate 100. The first heat transfer film 460 may be interposed between the second under-fill resin layer 320 and the thermal interface material layer 260 which is disposed below the first part P1 of the thermal pillar 250. The second heat transfer film 470 may be interposed between the third under-fill resin layer 420 and the thermal interface material layer 260 which is disposed below the second part P2 of the thermal pillar 250. The first and second heat transfer films 460 and 470 may contact the top surface of the package substrate 100.

The first and second chip stacks 300a and 300b and the semiconductor chip 400 may be disposed on the package substrate 100 in the opening OP of the thermal pillar 250. For example, the first and second chip stacks 300a and 300b and the semiconductor chip 400 may be disposed on the top surface of the package substrate 100. The second terminals 313 may be disposed on the top surface of the package substrate 100 and placed in contact with the top surface of the package substrate 100. The fourth terminals 410 may be disposed on the top surface of the package substrate 100 and placed in contact with the top surface of the package substrate 100. The second under-fill resin layer 320 may be disposed between the top surface of the package substrate 100 and each of the first and second chip stacks 300a and 300b, and the third under-fill resin layer 420 may be disposed between the top surface of the package substrate 100 and the semiconductor chip 400. In an exemplary embodiment of the present inventive concept, there may be no interposer substrate 200 discussed with reference to FIG. 2.

Figure 6:
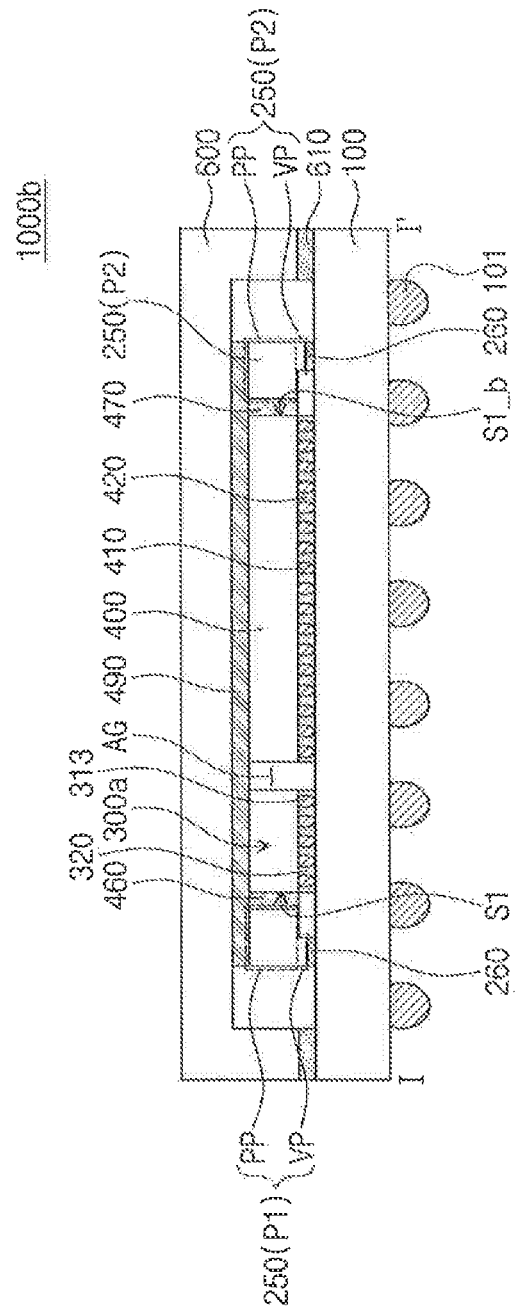
FIG. 6 is a cross-sectional view taken along line I-I' of FIG. 1, showing a semiconductor package according to an exemplary embodiment of the present inventive concept.

FIG. 6 is a cross-sectional view taken along line I-I' of FIG. 1, showing a semiconductor package according to an exemplary embodiment of the present inventive concept.

Referring to FIG. 6, a semiconductor package 1000b may include the semiconductor chip 400 and the first and second chip stacks 300a and 300b disposed on the top surface of the package substrate 100. Each of the first, second, third, and fourth parts P1, P2, P3, and P4 of the thermal pillar 250 may include the horizontal segment PP and the vertical segment VP. The vertical segment VP may be disposed on an end portion of the horizontal segment PP. The horizontal segment PP may have a bottom surface which is partially exposed by the vertical segment VP and the first heat transfer film 460. The first heat transfer film 460 may be interposed between the horizontal segment PP of the first part P1 of the thermal pillar 250 and the first lateral surface S1 of the first chip stack 300a and between the horizontal segment PP of the first part P1 of the thermal pillar 250 and the first lateral surface (see S1_a of FIG. 1) of the second chip stack (see 300b of FIG. 1). The first heat transfer film 460 may be spaced apart from lateral surfaces of the second under-fill resin layers 320, and the lateral surfaces of the second under-fill resin layers 320 are aligned with the first lateral surfaces S1 and S1_a of the first and second chip stacks 300a and 300b. The second heat transfer film 470 may be interposed between the horizontal segment PP of the second part P2 of the thermal pillar 250 and the first lateral surface S1_b of the semiconductor chip 400. The second heat transfer film 470 may be spaced apart from a lateral surface of the third under-fill resin layer 420, and the lateral surface of the third under-fill resin layer 420 is aligned with the first lateral surface S1_b of the semiconductor chip 400.

The thermal interface material layer 260 may be interposed between the top surface of the package substrate 100 and the vertical segments VP of the first, second, third, and fourth parts P1, P2, P3, and P4 of the thermal pillar 250. The thermal interface material layer 260 may be in contact with the top surface of the package substrate 100, and may be spaced apart from the bottom surfaces of the horizontal segments PP of the first, second, third, and fourth parts P1, P2, P3, and P4 of the thermal pillar 250. In an exemplary embodiment of the present inventive concept, there may be no interposer substrate 200 discussed with reference to FIG. 2.

Figure 7:
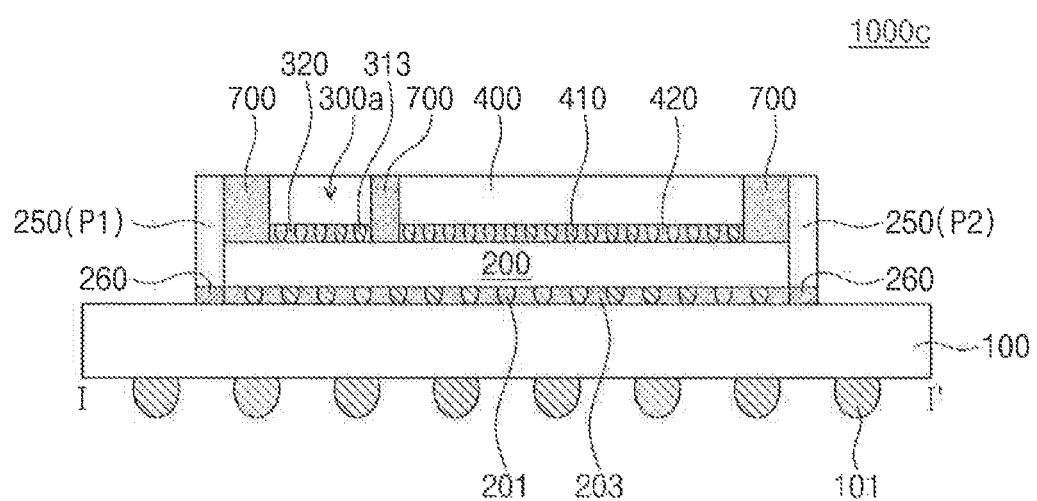
FIG. 7 is a cross-sectional view showing a semiconductor package according to an exemplary embodiment of the present inventive concept.

FIG. 7 is a cross-sectional view showing a semiconductor package according to an exemplary embodiment of the present inventive concept.

Referring to FIG. 7, a semiconductor package 1000c may include the thermal pillar 250 that may be disposed on the top surface of the package substrate 100. The interposer substrate 200 may be disposed on the top surface of the package substrate 100 in the opening OP of the thermal pillar 250. The lateral surfaces of the interposer substrate 200 may contact the thermal pillar 250. The thermal interface material layer 260 may be interposed between the thermal pillar 250 and the package substrate 100. For example, the thermal interface material layer 260 may be disposed between the bottom surface of the thermal pillar 250 and the top surface of the package substrate 100. The thermal interface material layer 260 may contact the first under-fill resin layer 203 and the top surface of the package substrate 100. The top surface of the thermal pillar 250 may be coplanar with those of the first and second chip stacks 300a and 300b and that of the semiconductor chip 400.

A molding layer 700 may be disposed in a space between the thermal pillar 250 and the first chip stack 300a, a space between the thermal pillar 250 and the second chip stack (see 300b of FIG. 1), a space between the first chip stack 300a and the semiconductor chip 400, a space between the second chip stack 300b and the semiconductor chip 400, and the thermal pillar 250 and the semiconductor chip 400. The molding layer 700 may have a top surface coplanar with that of the thermal pillar 250, those of the first and second chip stacks 300a and 300b, and that of the semiconductor chip 400. The molding layer 700 may include, for example, an epoxy molding compound (EMC).

In an exemplary embodiment of the present inventive concept, there may be no heat slug 600 discussed with reference to FIG. 2. Heat generated from the first and second chip stacks 300a and 300b and from the semiconductor chip 400 may be radiated through the interposer substrate 200 to the thermal pillar 250 and the package substrate 100.

Figure 8:
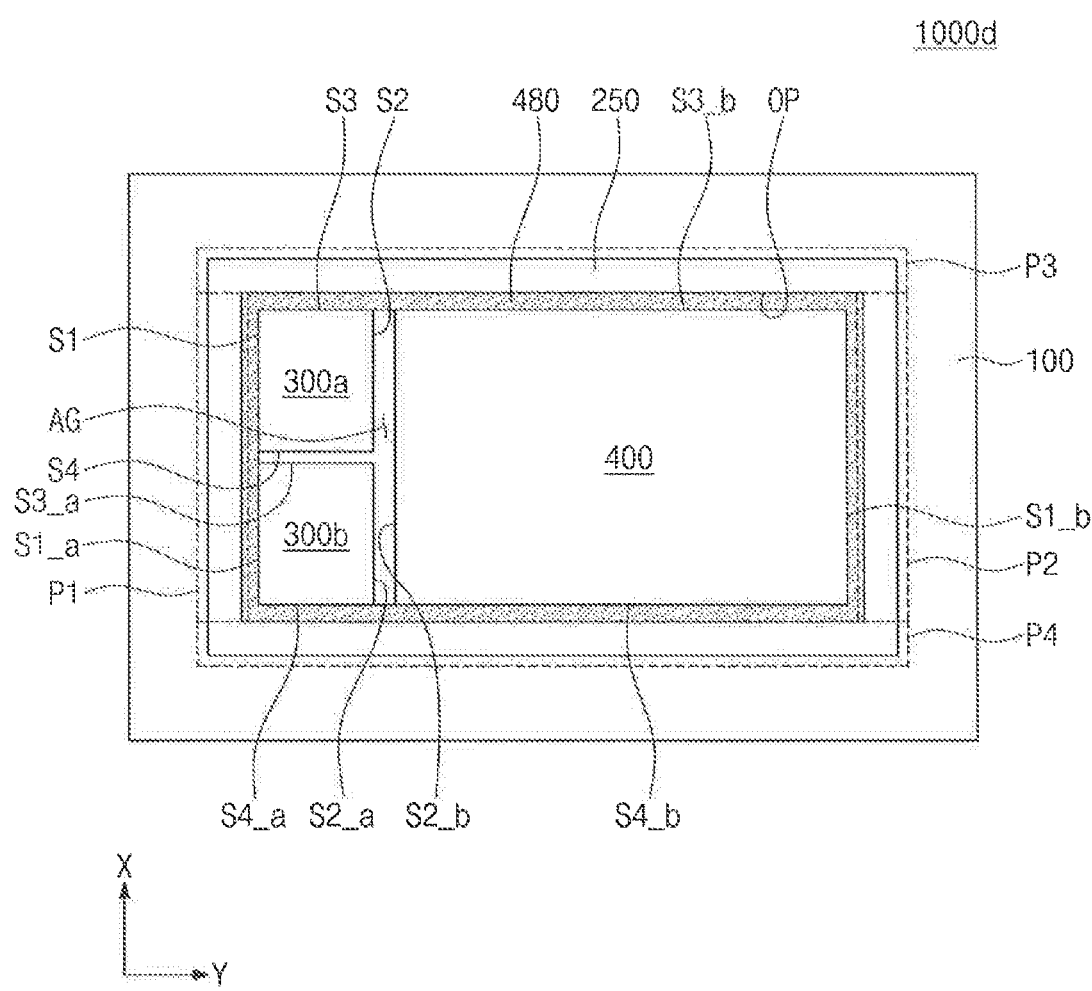
FIG. 8 is a plan view showing a semiconductor package according to an exemplary embodiment of the present inventive concept.

FIG. 8 is a plan view showing a semiconductor package according to an exemplary embodiment of the present inventive concept.

Referring to FIG. 8, a semiconductor package 1000d may include a heat transfer film 480 on inner surfaces of the thermal pillar 250 which are exposed to the opening OP of the thermal pillar 250. For example, the heat transfer film 480 may intermediately extend from a space between the first lateral surface S1 of the first chip stack 300a and the first part P1 of the thermal pillar 250 toward a space between the first lateral surface S1_a of the second chip stack 300b and the first part P1 of the thermal pillar 250. In addition, the heat transfer film 480 may extend in a space between the third lateral surface S3 of the first chip stack 300a and the third part P3 of the thermal pillar 250, a space between the third lateral surface S3_b of the semiconductor chip 400 and the third part P3 of the thermal pillar 250, a space between the first surface S1_b of the semiconductor chip 400 and the second part P2 of the thermal pillar 250, a space between the fourth lateral surface S4_b of the semiconductor chip 400 and the fourth part P4 of the thermal pillar 250, and a space between the fourth lateral surface S4_a of the second chip stack 300b and the fourth part P4 of the thermal pillar 250. For example, the heat transfer film 480 may have annular shape.

The heat transfer film 480 may be disposed neither in a space between the first and second chip stacks 300a and 300b, nor in a space between the first chip stack 300a and the semiconductor chip 400, and nor in a space between the second chip stack 300b and the semiconductor chip 400. The heat transfer film 480 may expose the second and fourth lateral surfaces S2 and S4 of the first chip stack 300a, the third and second lateral surfaces S3_a and S2_a of the second chip stack 300b, and the second lateral surface S2_b of the semiconductor chip 400.

Figure 9:
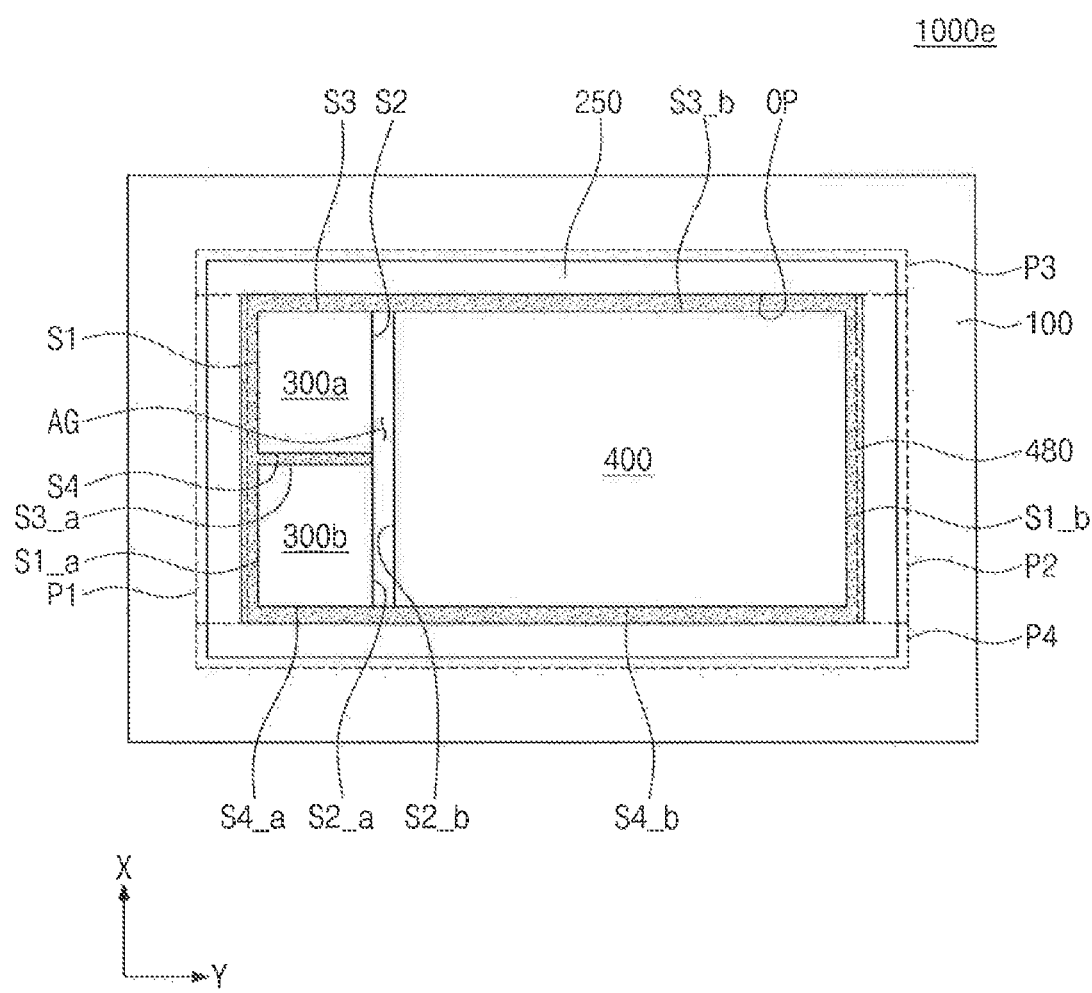
FIG. 9 is a plan view illustrating a semiconductor package according to an exemplary embodiment of the present inventive concept.

FIG. 9 is a plan view illustrating a semiconductor package according to an exemplary embodiment of the present inventive concept.

Referring to FIG. 9, a semiconductor package 1000e may include a heat transfer film 480 identical or similar to that shown in FIG. 8, and the heat transfer film 480 may further extend into a space between the first and second chip stacks 300a and 300b. For example, the heat transfer film 480 may intermediately extend from a space between the first lateral surface S1 of the first chip stack 300a and the first part P1 of the thermal pillar 250 toward a space between the first lateral surface S1_a of the second chip stack 300b and the first part P1 of the thermal pillar 250. In addition, the heat transfer film 480 may extend in a space between the third space S3 of the first chip stack 300a and the third part P3 of the thermal pillar 250, a space between the third lateral surface S3_b of the semiconductor chip 400 and the third part P3 of the thermal pillar 250, a space between the first lateral surface S1_b of the semiconductor chip 400 and the second part P2 of the thermal pillar 250, a space between the fourth lateral surface S4_b of the semiconductor chip 400 and the fourth part P4 of the thermal pillar 250, a space between the fourth lateral surface S4_a of the second chip stack 300b and the fourth part P4 of the thermal pillar 250, and a space between the fourth lateral surface S4 of the first chip stack 300a and the third lateral surface S3_a of the second chip stack 300b. The heat transfer film 480 may expose the second lateral surface S2 of the first chip stack 300a, the second lateral surface S2_a of the second chip stack 300b, and the second lateral surface S2_b of the semiconductor chip 400.

In an exemplary embodiment of the present inventive concept, the air gap AG may be provided between the first chip stack 300a and the semiconductor chip 400 and between the second chip stack 300b and the semiconductor chip 400.

Figure 10:
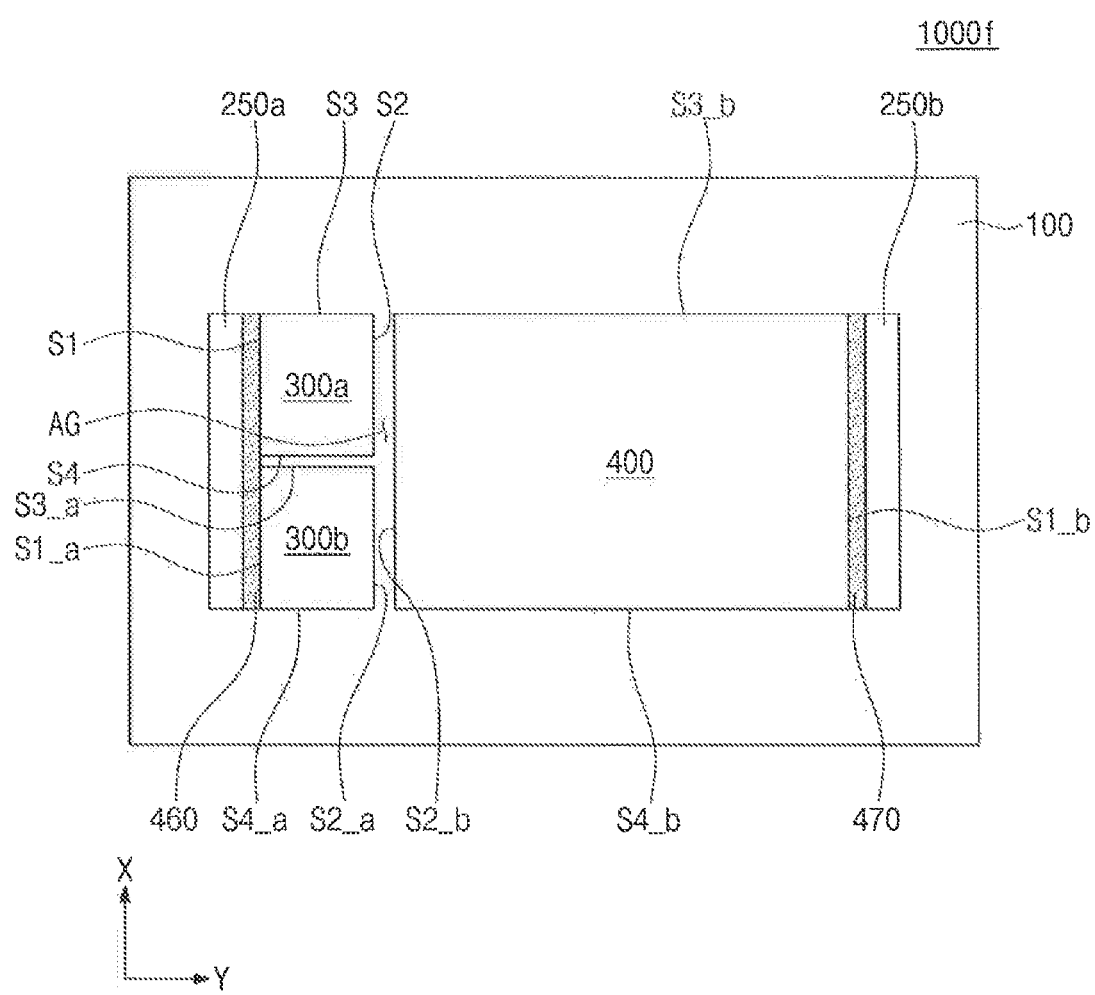
FIG. 10 is a plan view showing a semiconductor package according to an exemplary embodiment of the present inventive concept.

FIG. 10 is a plan view showing a semiconductor package according to an exemplary embodiment of the present inventive concept.

Referring to FIG. 10, a semiconductor package 1000f may include a first thermal pillar 250a and a second thermal pillar 250b. The first thermal pillar 250a may be disposed on the first lateral surfaces S1 and S1_a of the first and second chip stacks 300a and 300b, and the second thermal pillar 250b may be disposed on the first lateral surface S1_b of the semiconductor chip 400. The first and second thermal pillars 250a and 250b may be parallel to the first direction X and may be positioned to face each other. The first heat transfer film 460 may be interposed between the first thermal pillar 250a and the first lateral surface S1 of the first chip stack 300a, and may intermediately extend between the first thermal pillar 250a and the first lateral surface S1_a of the second chip stack 300b. The second heat transfer film 470 may be interposed between the second thermal pillar 250b and the first lateral surface S1_b of the semiconductor chip 400. The first and second heat transfer films 460 and 470 may expose the second, third, and fourth lateral surfaces S2, S3, and S4 of the first chip stack 300a, and may also expose the second, third, and fourth lateral surfaces S2_a, S3_a, and S4_a of the second chip stack 300b. The second, third, and fourth lateral surfaces S2_b, S3_b, and S4_b of the semiconductor chip 400 may be exposed by the first and second heat transfer films 460 and 470.

Figure 11:
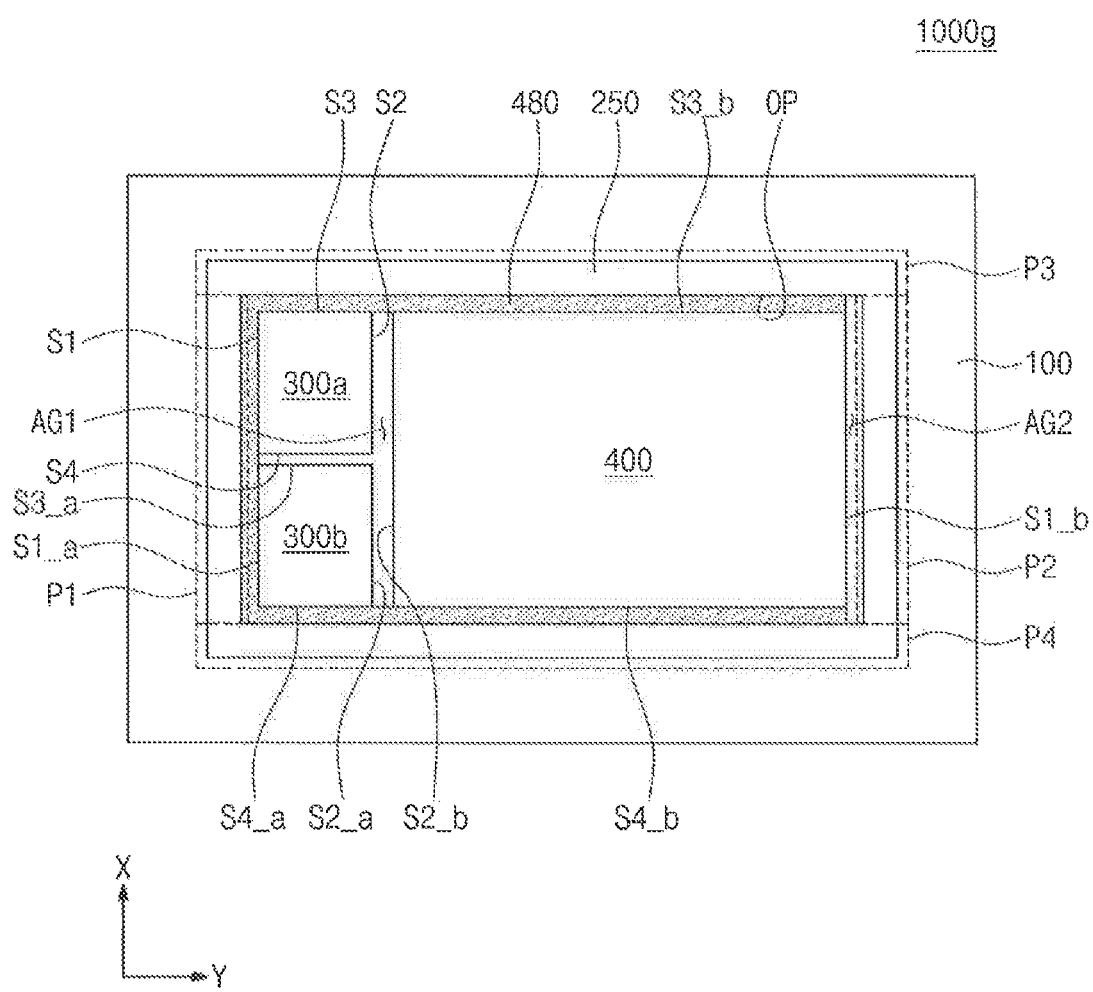
FIG. 11 is a plan view showing a semiconductor package according to an exemplary embodiment of the present inventive concept.

FIG. 11 is a plan view showing a semiconductor package according to an exemplary embodiment of the present inventive concept.

Referring to FIG. 11, a semiconductor package 1000g may include a heat transfer film 480 between the first part P1 of the thermal pillar 250 and the first lateral surface S1 of the first chip stack 300a. The heat transfer film 480 may extend from a space between the first part P1 of the thermal pillar 250 and the first lateral surface S1 of the first chip stack 300a toward a space between the first part P1 of the thermal pillar 250 and the first lateral surface S1_a of the second chip stack 300b, a space between the third part P3 of the thermal pillar 250 and the third lateral surface S3 of the first chip stack 300a, a space between the fourth part P4 of the thermal pillar 250 and the fourth lateral surface S4_a of the second chip stack 300b, a space between the third part P3 of the thermal pillar 250 and the third lateral surface S3_b of the semiconductor chip 400, and a space between the fourth part P4 of the thermal pillar 250 and the fourth lateral surface S4_b of the semiconductor chip 400. The heat transfer film 480 may expose the first and second lateral surfaces S1_b and S2_b of the semiconductor chip 400, the second and fourth lateral surfaces S2 and S4 of the first chip stack 300a, and the second and third lateral surfaces S2_a and S3_a of the second chip stack 300b. For example, the heat transfer film 480 may not cover the first and second lateral surfaces S1_b and S2_b of the semiconductor chip 400, the second and fourth lateral surfaces S2 and S4 of the first chip stack 300a, and the second and third lateral surfaces S2_a and S3_a of the second chip stack 300b.

A first air gap AG1 may be provided between the first chip stack 300a and the second chip stack 300b, between the first chip stack 300a and the semiconductor chip 400, and between the second chip stack 300b and the semiconductor chip 400. The first air gap AG1 may be covered with the upper thermal interface material layer (see 490 of FIG. 2). A second air gap AG2 may be provided between the semiconductor chip 400 and the second part P2 of the thermal pillar 250. The second air gap AG2 may be covered with the upper thermal interface material layer 490.

Figure 12:
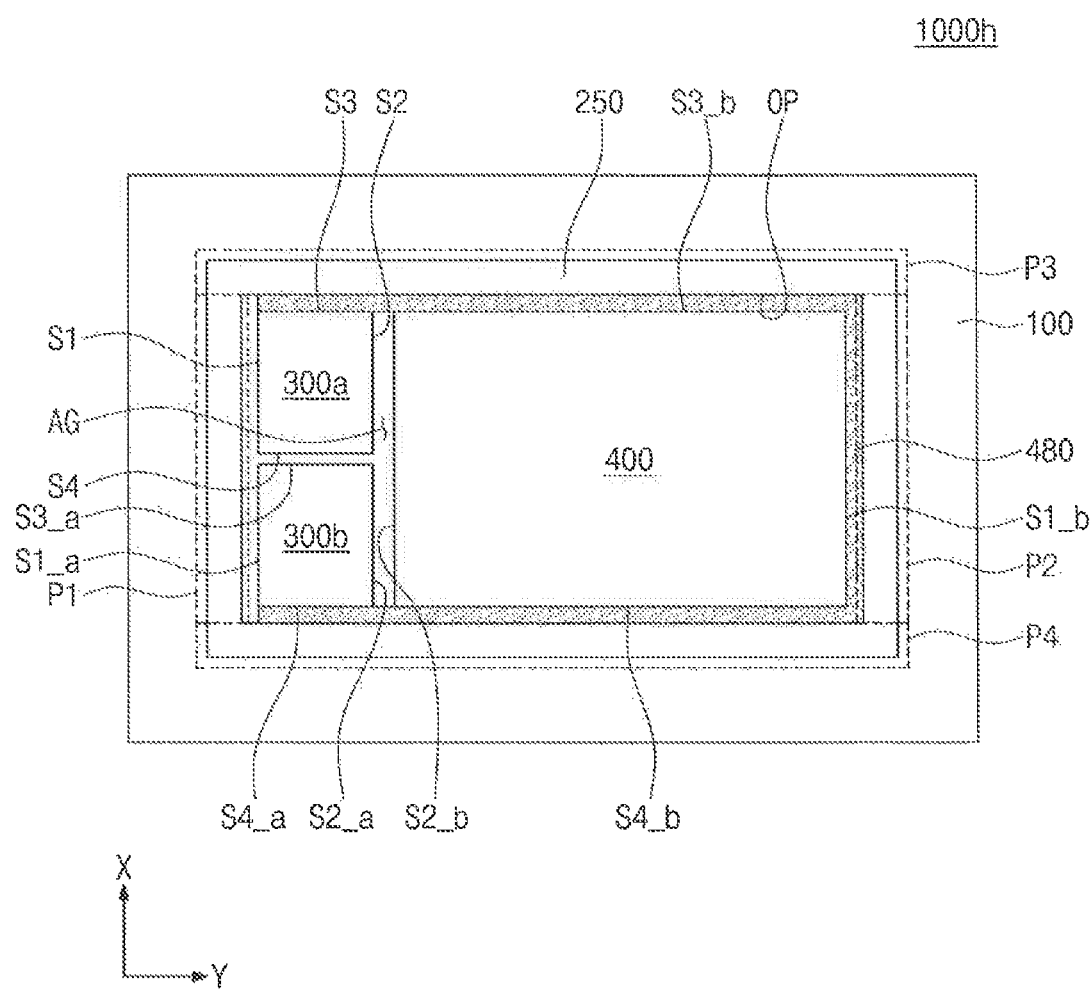
FIG. 12 is a plan view illustrating a semiconductor package according to an exemplary embodiment of the present inventive concept.

FIG. 12 is a plan view illustrating a semiconductor package according to an exemplary embodiment of the present inventive concept.

Referring to FIG. 12, a semiconductor package 1000h may include a heat transfer film 480 between the third lateral surface S3 of the first chip stack 300a and the third part P3 of the thermal pillar 250. The heat transfer film 480 may extend from a space between the third lateral surface S3 of the first chip stack 300a and the third part P3 of the thermal pillar 250 toward a space between the third lateral surface S3_b of the semiconductor chip 400 and the third part P3 of the thermal pillar 250. In addition, the heat transfer film 480 may extend in a space between the first lateral surface S1_b of the semiconductor chip 400 and the second part P2 of the thermal pillar 250, a space between the fourth lateral surface S4_b of the semiconductor chip 400 and the fourth part P4 of the thermal pillar 250, and a space between the fourth lateral surface S4_a of the second chip stack 300b and the fourth part P4 of the thermal pillar 250. The heat transfer film 480 may expose the first, second, and fourth lateral surfaces S1, S2, and S4 of the first chip stack 300a, the first, second, and third lateral surfaces S1_a, S2_a, and S3_a of the second chip stack 300b, and the second lateral surface S2_b of the semiconductor chip 400. In this case, the heat transfer film 480 may not cover the first, second, and fourth lateral surfaces S1, S2, and S4 of the first chip stack 300a, the first, second, and third lateral surfaces S1_a, S2_a, and S3_a of the second chip stack 300b, and the second lateral surface S2_b of the semiconductor chip 400.

The air gap AG may be provided between the first chip stack 300a and the first part P1 of the thermal pillar 250, between the second chip stack 300b and the first part P1 of the thermal pillar 250, between the first chip stack 300a and the semiconductor chip 400, between the second chip stack 300b and the semiconductor chip 400, and between the first and second chip stacks 300a and 300b. The air gap AG may be covered with the upper thermal interface material layer (see 490 of FIG. 2).

Figure 13:
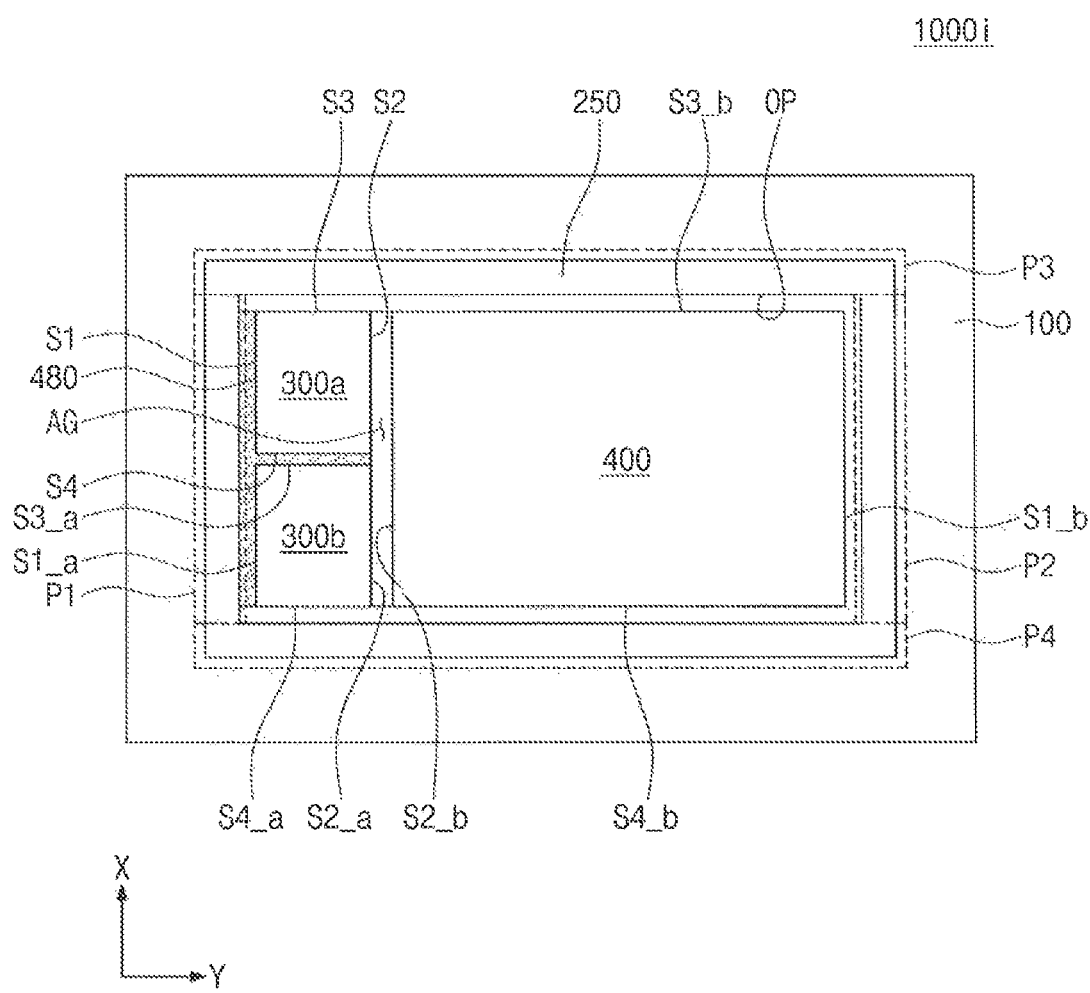
FIG. 13 is a plan view showing a semiconductor package according to an exemplary embodiment of the present inventive concept.

FIG. 13 is a plan view showing a semiconductor package according to an exemplary embodiment of the present inventive concept.

Referring to FIG. 13, a semiconductor package 1000i may include a heat transfer film 480 between the first lateral surface S1 of the first chip stack 300a and the first part P1 of the thermal pillar 250. The heat transfer film 480 may extend from a space between the first lateral surface S1 of the first chip stack 300a and the first part P1 of the thermal pillar 250 toward a space between the first lateral surface S1_a of the second chip stack 300b and the first part P1 of the thermal pillar 250 and toward a space between the fourth lateral surface S4 of the first chip stack 300a and the third lateral surface S3_a of the second chip stack 300b. The heat transfer film 480 may expose the second and third lateral surfaces S2 and S3 of the first chip stack 300a, the second and fourth lateral surfaces S2_a and S4_a of the second chip stack 300b, and the first, second, third, and fourth lateral surfaces S1_b, S2_b, and S4_b of the semiconductor chip 400. In this case, the heat transfer film 480 may not cover the second and third lateral surfaces S2 and S3 of the first chip stack 300a, the second and fourth lateral surfaces S2_a and S4_a of the second chip stack 300b, and the first, second, third, and fourth lateral surfaces S1_b, S3_b, and S4_b of the semiconductor chip 400.

The air gap AG may be provided between the first chip stack 300a and the semiconductor chip 400, between the second chip stack 300b and the semiconductor chip 400, between the first chip stack 300a and the third part P3 of the thermal pillar 250, between the second chip stack 300b and the fourth part P4 of the thermal pillar 250, between the semiconductor chip 400 and the third part P3 of the thermal pillar 250, between the semiconductor chip 400 and the second part P2 of the thermal pillar 250, and between the semiconductor chip 400 and the fourth part P4 of the thermal pillar 250. The air gap AG may be covered with the upper thermal interface material layer (see 490 of FIG. 2).

Figure 14:
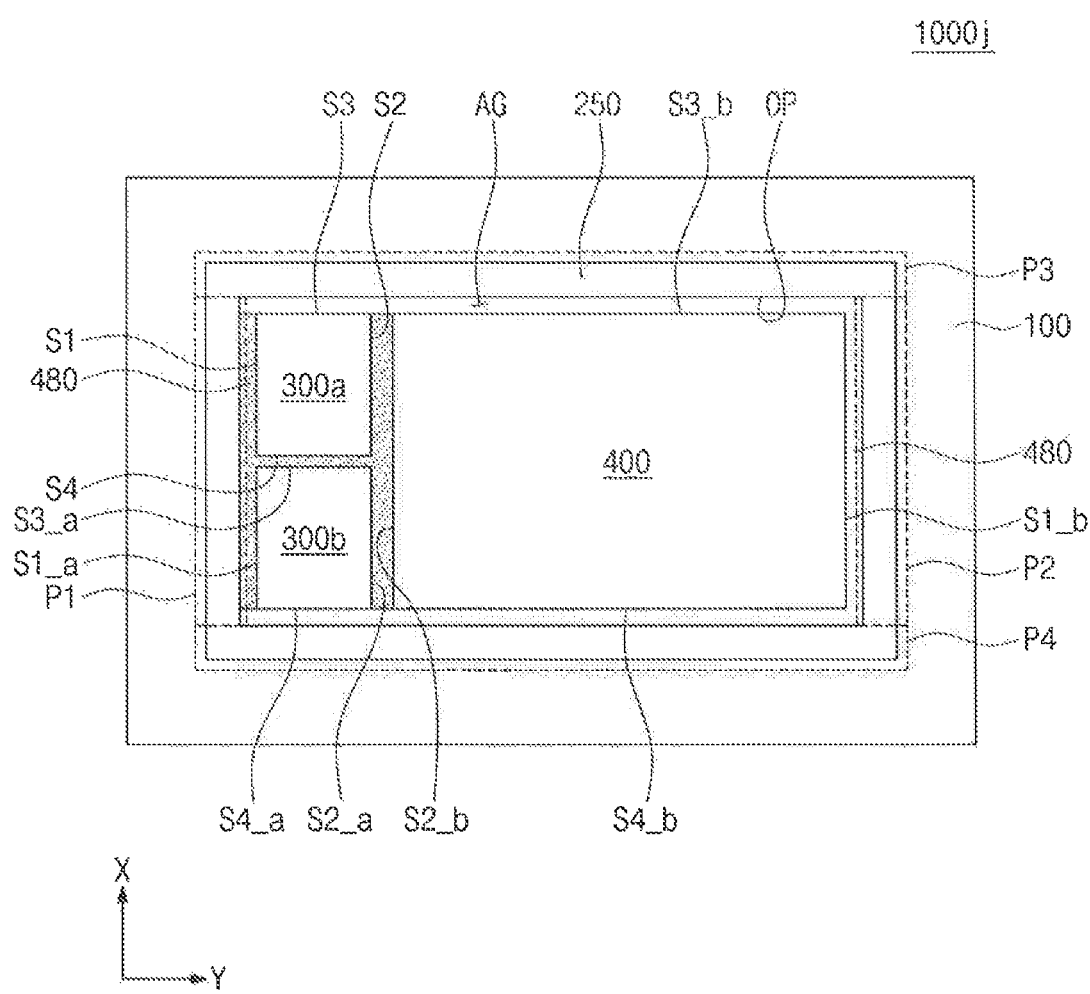
FIG. 14 is a plan view illustrating a semiconductor package according to an exemplary embodiment of the present inventive concept.

FIG. 14 is a plan view illustrating a semiconductor package according to an exemplary embodiment of the present inventive concept.

Referring to FIG. 14, a semiconductor package 1000j may include a heat transfer film 480 between the first lateral surface S1 of the first chip stack 300a and the first part P1 of the thermal pillar 250. The heat transfer film 480 may extend from a space between the first lateral surface S1 of the first chip stack 300a and the first part P1 of the thermal pillar 250 toward a space between the first lateral surface S1_a of the second chip stack 300b and the first part P1 of the thermal pillar 250. In addition, the heat transfer film 480 may extend in a space between the fourth lateral surface S4 of the first chip stack 300a and the third lateral surface S3_a of the second chip stack 300b, a space between the second lateral surface S2 of the first chip stack 300a and the second lateral surface S2_b of the semiconductor chip 400, and a space between the second lateral surface S2_a of the second chip stack 300b and the second lateral surface S2_b of the semiconductor chip 400. The heat transfer film 480 may expose the third lateral surface S3 of the first chip stack 300a, the fourth lateral surface S4_a of the second chip stack 300b, and the first, third, and fourth lateral surfaces S1_b, S3_b, and S4_b of the semiconductor chip 400. In this case, the heat transfer film 480 may not cover the third lateral surface S3 of the first chip stack 300a, the fourth lateral surface S4_a of the second chip stack 300b, and the first, third, and fourth lateral surfaces S1_b, S3_b, and S4_b of the semiconductor chip 400.

The air gap AG may be provided between the first chip stack 300a and the third part P3 of the thermal pillar 250, between the semiconductor chip 400 and the third part P3 of the thermal pillar 250, between the semiconductor chip 400 and the second part P2 of the thermal pillar 250, between the semiconductor chip 400 and the fourth part P4 of the thermal pillar 250, and between the second chip stack 300b and the fourth part P4 of the thermal pillar 250. The air gap AG may be covered with the upper thermal interface material layer (see 490 of FIG. 2).

Figure 15:
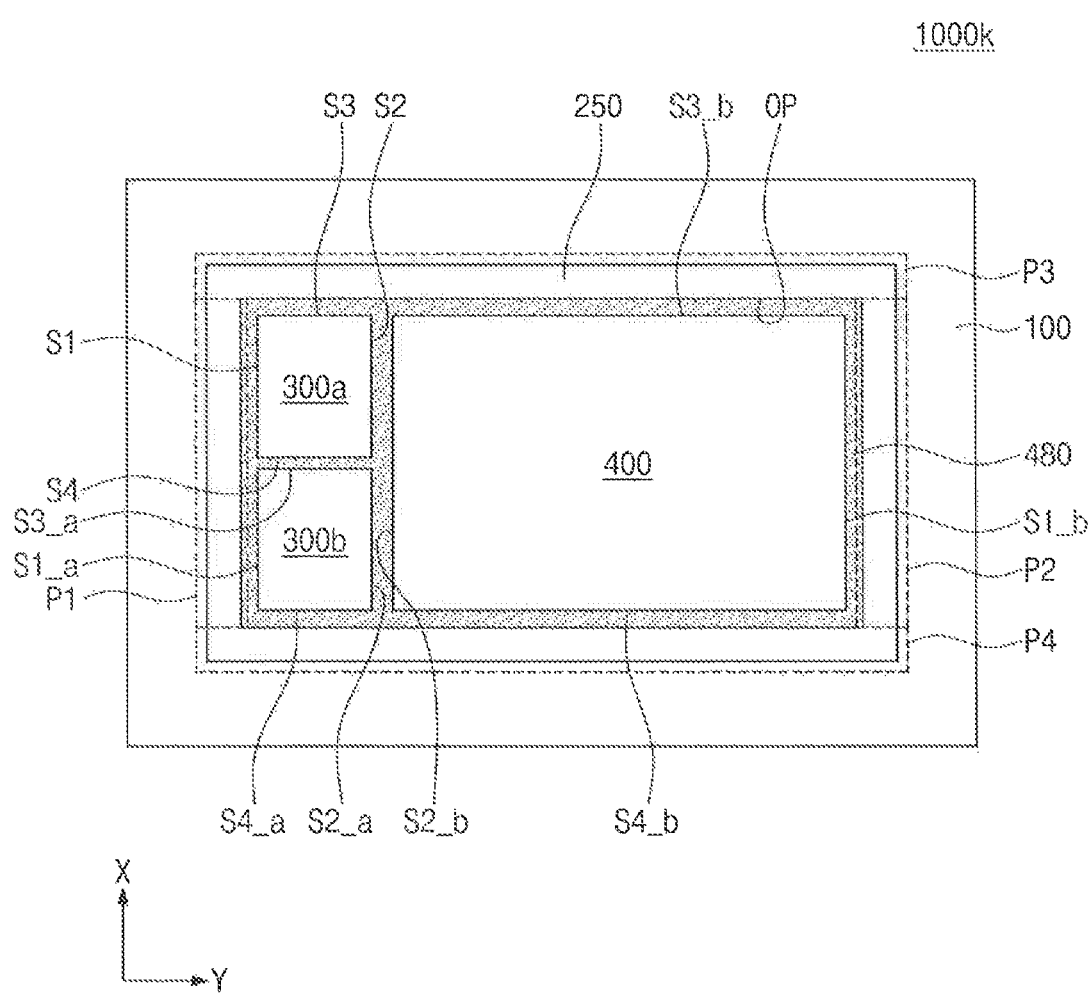
FIG. 15 is a plan view illustrating a semiconductor package according to an exemplary embodiment of the present inventive concept.

FIG. 15 is a plan view illustrating a semiconductor package according to an exemplary embodiment of the present inventive concept.

Referring to FIG. 15, a semiconductor package 1000k may include a heat transfer film 480 which fills a space in the opening OP of the thermal pillar 250. For example, the heat transfer film 480 may extend from a space between the first lateral surface S1 of the first chip stack 300a and the first part P1 of the thermal pillar 250 toward a space between the first lateral surface S1_a of the second chip stack 300b and the first part P1 of the thermal pillar 250. In addition, the heat transfer film 480 may extend in a space between the fourth lateral surface S4 of the first chip stack 300a and the third lateral surface S3_a of the second chip stack 300b, a space between the third lateral surface S3 of the first chip stack 300a and the third part P3 of the thermal pillar 250, a space between the fourth lateral surface S4_a of the second chip stack 300b and the fourth part P4 of the thermal pillar 250, a space between the second lateral surface S2 of the first chip stack 300a and the second lateral surface S2_b of the semiconductor chip 400, a space between the second lateral surface S2_a of the second chip stack 300b and the second lateral surface S2_b of the semiconductor chip 400, a space between the third lateral surface S3_b of the semiconductor chip 400 and the third part P3 of the thermal pillar 250, a space between the first lateral surface S1_b of the semiconductor chip 400 and the second part P2 of the thermal pillar 250, and a space between the fourth lateral surface S4_b of the semiconductor chip 400 and the fourth part P4 of the thermal pillar 250. The heat transfer film 480 may surround the first, second, third, and fourth lateral surfaces S1, S2, S3, and S4 of the first chip stack 300a, and may also surround the first, second, third, and fourth lateral surfaces S1_a, S2_a, S3_a, and S4_a of the second chip stack 300b. In addition, the heat transfer film 480 may surround the first, second, third, and fourth lateral surfaces S1_b, S2_b, S3_b, and S4_b of the semiconductor chip 400. In an exemplary embodiment of the present inventive concept, the air gap AG may not be provided.

Figure 16:
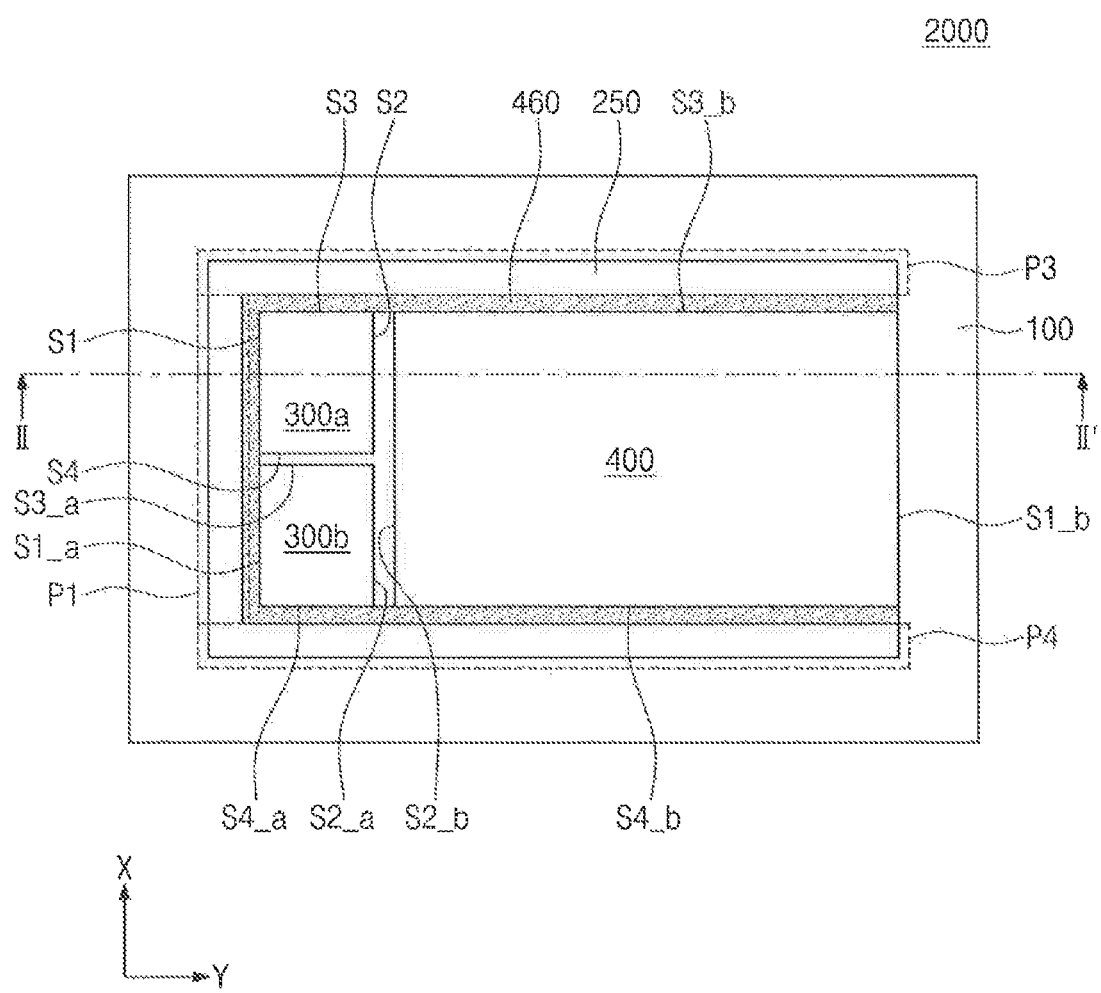
FIG. 16 is a plan view showing a semiconductor package according to an exemplary embodiment of the present inventive concept.
Figure 17:
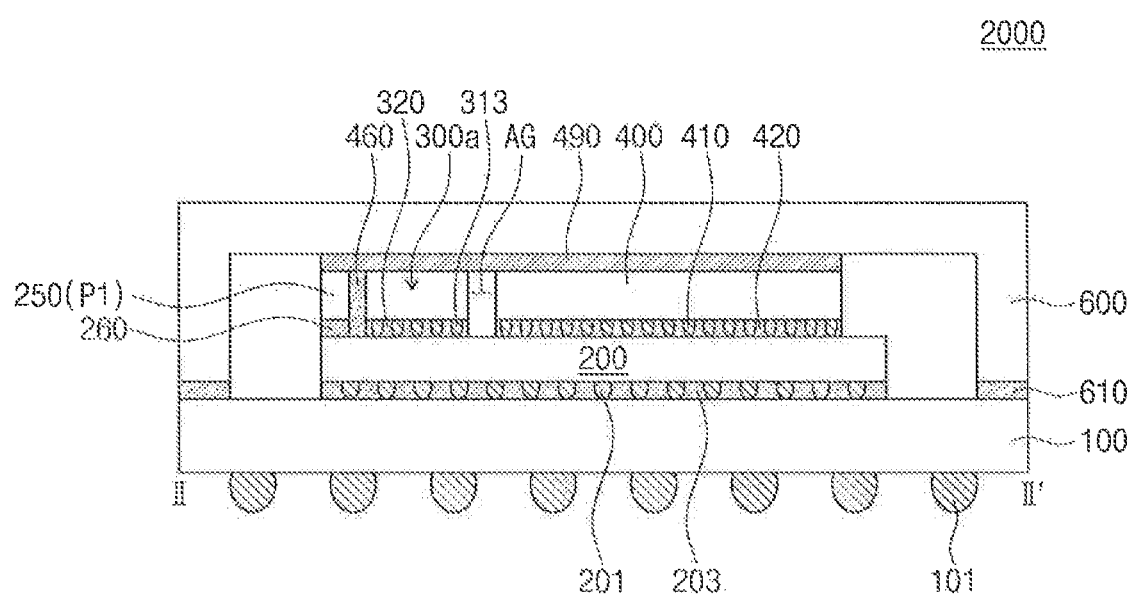
FIG. 17 is a cross-sectional view taken along line II-II' of FIG. 16, showing a semiconductor package according to an exemplary embodiment of the present inventive concept.

FIG. 16 is a plan view showing a semiconductor package according to an exemplary embodiment of the present inventive concept. FIG. 17 is a cross-sectional view taken along line II-II' of FIG. 16, showing a semiconductor package according to an exemplary embodiment of the present inventive concept.

Referring to FIGS. 16 and 17, a semiconductor package 2000 may include the thermal pillar 250 including the first part P1, the third part P3, and the fourth part P4. For example, the thermal pillar 250 may not include the second part P2. On the interposer substrate 200, the first part P1 may be disposed on the first lateral surface S1 of the first chip stack 300a and on the first lateral surface S1_a of the second chip stack 300b. On the interposer substrate 200, the third part P3 may be disposed on the third lateral surface S3 of the first chip stack 300a and on the third lateral surface S3_b of the semiconductor chip 400. On the interposer substrate 200, the fourth part P4 may be disposed on the fourth lateral surface S4_a of the second chip stack 300b and on the fourth lateral surface S4_b of the semiconductor chip 400. For example, the first, third and fourth parts P1, P3, and P4 may disposed on the top surface of the interposer substrate 200. The first part P1 of the thermal pillar 250 may extend in the first direction X. The third and fourth parts P3 and P4 of the thermal pillar 250 may extend in parallel along the second direction Y.

A heat transfer film 460 may be interposed between the first lateral surface S1 of the first chip stack 300a and the first part P1 of the thermal pillar 250 and between the first lateral surface S1_a of the second chip stack 300b and the first part P1 of the thermal pillar 250. The heat transfer film 460 disposed between the first lateral surface S1 of the first chip stack 300a and the first part P1 of the thermal pillar 250 may intermediately extend toward a space between the third lateral surface S3 of the first chip stack 300a and the third part P3 of the thermal pillar 250 and continue toward a space between the third lateral surface S3_b of the semiconductor chip 400 and the third part P3 of the thermal pillar 250. The heat transfer film 460 disposed between the first lateral surface S1_a of the second chip stack 300b and the first part P1 of the thermal pillar 250 may intermediately extend toward a space between the fourth lateral surface S4_a of the second chip stack 300b and the fourth part P4 of the thermal pillar 250 and continue toward a space between the fourth lateral surface S4_b of the semiconductor chip 400 and the fourth part P4 of the thermal pillar 250.

In an exemplary embodiment of the present inventive concept, the thermal pillar 250 may not be provided on the first lateral surface S1_b of the semiconductor chip 400. The first lateral surface S1_b of the semiconductor chip 400 may be exposed by the heat transfer film 460. For example, the heat transfer film 460 may not cover the first lateral surface S1_b of the semiconductor chip 400.

In an exemplary embodiment of the present inventive concept, the thermal pillar 250 may have the same shape as that shown in FIG. 16, but the first part P1 thereof may be located at a different position from that shown in FIG. 16. For example, on the top surface of the interposer substrate 200, the first part P1 of the thermal pillar 250 may be disposed on the first lateral surface S1_b of the semiconductor chip 400. On the top surface of the interposer substrate 200, the third part P3 of the thermal pillar 250 may be disposed on the third lateral surface S3 of the first chip stack 300a and on the third lateral surface S3_b of the semiconductor chip 400. On the top surface of the interposer substrate 200, the fourth part P4 of the thermal pillar 250 may be disposed on the fourth lateral surface S4_a of the second chip stack 300b and on the fourth lateral surface S4_b of the semiconductor chip 400.

Figure 18:
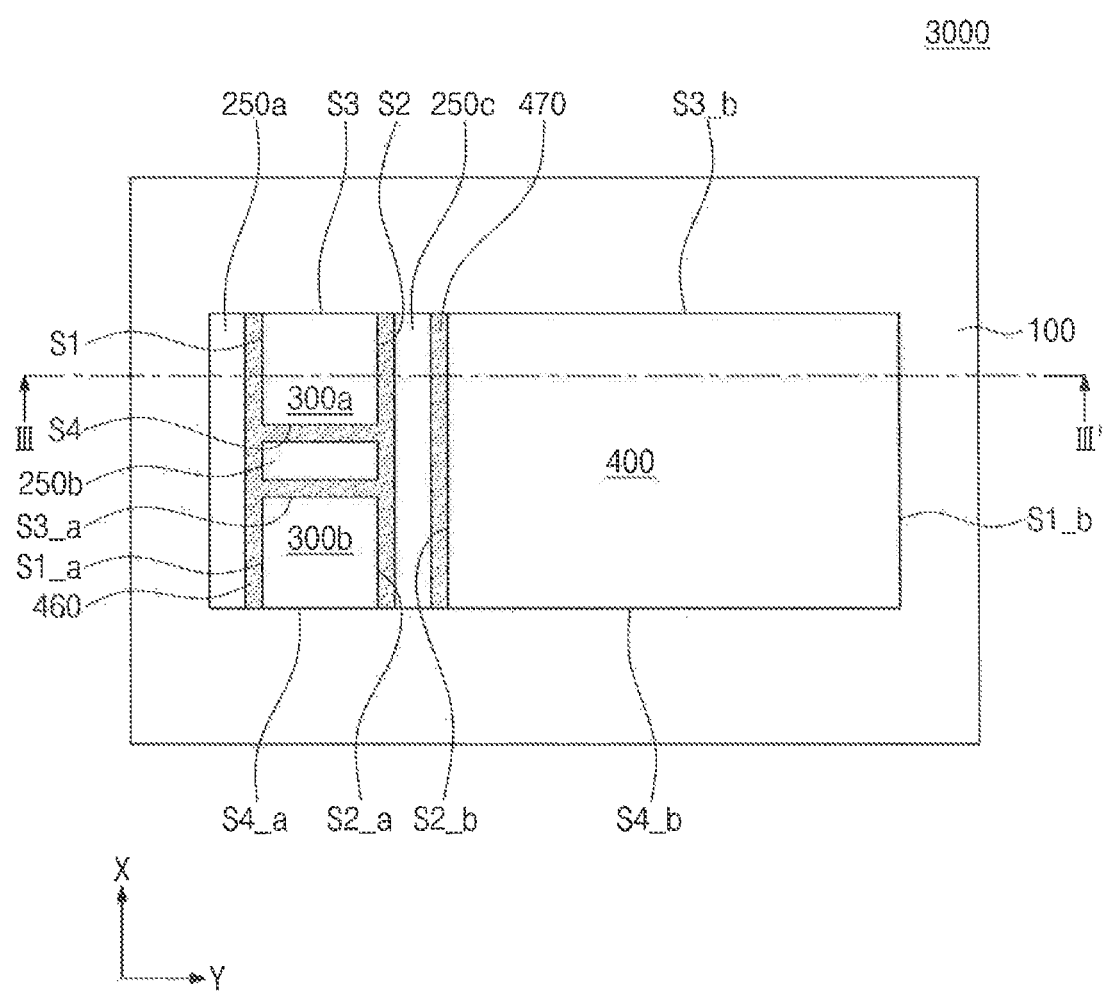
FIG. 18 is a plan view showing a semiconductor package according to an exemplary embodiment of the present inventive concept.
Figure 19:
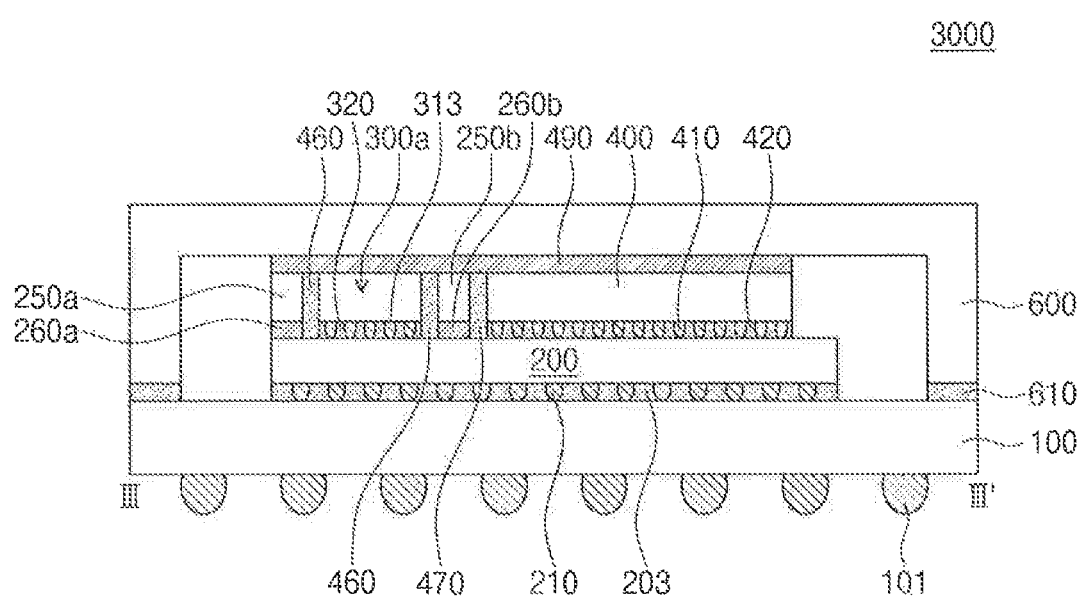
FIG. 19 is a cross-sectional view taken along line III-III' of FIG. 18, showing a semiconductor device according to an exemplary embodiment of the present inventive concept.

FIG. 18 is a plan view showing a semiconductor package according to an exemplary embodiment of the present inventive concept. FIG. 19 is a cross-sectional view taken along line III-III' of FIG. 18, showing a semiconductor device according to an exemplary embodiment of the present inventive concept.

Referring, to FIGS. 18 and 19, a semiconductor package 3000 may include a first thermal pillar 250a, a second thermal pillar 250b, a third thermal pillar 250c, a first heat transfer film 460, a second heat transfer film 470, a first thermal interface material layer 260a, and a third thermal interface material layer 260b. On the top surface of the interposer substrate 200, the first thermal pillar 250a may be disposed on the first lateral surface S1 of the first chip stack 300a and on the first lateral surface S1_a of the second chip stack 300b. The second thermal pillar 250b may be disposed between the fourth lateral surface S4 of the first chip stack 300a and the third lateral surface S3_a of the second chip stack. 300b. The first and second thermal pillars 250a and 250b may be spaced apart from each other. For example, the first thermal pillar 250a may extend in the first direction X and the second thermal pillar 250b may extend in the second direction Y. The third thermal pillar 250c may extend from a space between the second lateral surface S2 of the first chip stack 300a and the second lateral surface S2_b of the semiconductor chip 400 toward a space between the second thermal pillar 250b and the second lateral surface S2_b of the semiconductor chip 400 and toward a space between the second lateral surface S2_a of the second chip stack 300b and the second lateral surface S2_b of the semiconductor chip 400. The third thermal pillar 250c may be spaced apart from the first and second thermal pillars 250a and 250b. For example, the third thermal pillar 250c may extend in the first direction X. The first, second, and third thermal pillars 250a, 250b, and 250c may include, for example, a silicon material or a high-k dielectric material. The high-k dielectric material may include, for example, $HfO_2$, $Al_2O_3$, $HfAlO_3$, $Ta_2O_3$, and/or $TiO_2$. As used herein, the phrase "high-k" may mean any material with a dielectric constant greater than that of silicon dioxide, in an exemplary embodiment of the present inventive concept, none of the first, second, and third thermal pillars 250a, 250b, and 250c may be provided on the third lateral surface S3 of the first chip stack 300a and on the third lateral surface S3_b of the semiconductor chip 400. None of the first, second, and third thermal pillars 250a, 250b, and 250c may be provided on the fourth lateral surface S4_a of the second chip stack 300b and on the fourth lateral surface S4_b of the semiconductor chip 400. In addition, none of the first, second, and third thermal pillars 250a, 250b, and 250c may be provided on the first lateral surface S1_b of the semiconductor chip 400.

The first thermal interface material layer 260a may be interposed between the first thermal pillar 250a and the interposer substrate 200. For example, the first thermal interface material layer 260a may be disposed between a bottom surface of the first thermal pillar 250a and the top surface of the interposer substrate 200. The first thermal interface material layer 260a may fix the first thermal pillar 250a on the top surface of the interposer substrate 200. A second thermal interface material layer may be interposed between the second thermal pillar 250b and the interposer substrate 200. For example, the second thermal interface material layer may be disposed between a bottom surface of the second thermal pillar 250b and the top surface of the interposer substrate 200. The second thermal interface material layer may fix the second thermal pillar 250b on the top surface of the interposer substrate 200. The third thermal interface material layer 260b may be interposed between the third thermal pillar 250c and the interposer substrate 200. For example, the third thermal interface material layer 260b may be disposed between a bottom surface of the third thermal pillar 250c and the top surface of the interposer substrate 200. The third thermal interface material layer 260b may fix the third thermal pillar 250c on the top surface of the interposer substrate 200. The first thermal interface material layer 260a, the second thermal interface material layer, and the third thermal interface material layer 260b may include, for example, thermal grease, epoxy materials, or solid particles such as indium.

The first heat transfer film 460 may be interposed between the first thermal pillar 250a and the first lateral surface S1 of the first chip stack 300a, between the first thermal pillar 250a and the second thermal pillar 250b, and between the first thermal pillar 250a and the first lateral surface S1_a of the second chip stack 300b. The first heat transfer film 460 may intermediately extend toward a space between the fourth lateral surface S4 of the first chip stack 300a and the second thermal pillar 250b and continue toward a space between the third lateral surface S3_a of the second chip stack 300b and the second thermal pillar 250b. In addition, the first heat transfer film 460 may intermediately extend toward a space between the second lateral surface S2 of the first chip stack 300a and the third thermal pillar 250c, a space between the second thermal pillar 250b and the third thermal pillar 250c, and continue toward a space between the second lateral surface S2_a of the second chip stack 300b and the third thermal pillar 250c. The first heat transfer film 460 may be made of a single layer; however, the present inventive concept is not limited thereto, and the first heat transfer film 460 may be made of a plurality of layers. The first heat transfer film 460 may contact one lateral surface of the first thermal interface material layer 260a, opposite lateral surfaces of the second thermal interface material layer, and a first lateral surface of the third thermal interface material layer 260b. For example, the second thermal interface material layer may be surrounded by the first heat transfer film 460.

The second heat transfer film 470 may be interposed between the third thermal pillar 250c and the second lateral surface S2_b of the semiconductor chip 400. The second heat transfer film 470 may contact a second lateral surface, opposite the first lateral surface, of the third thermal interface material layer 260b. The second heat transfer film 470 may be spaced apart from the first heat transfer film 460. In an exemplary embodiment of the present inventive concept, the first and second heat transfer films 460 and 470 may not cover the third lateral surface S3 of the first chip stack 300a, the fourth lateral surface S4_a of the second chip stack 300b, and the first, third, and fourth lateral surfaces S1_b, S3_b, and S4_b of the semiconductor chip 400.

The semiconductor package 3000 might not include the air gap AG discussed with reference to FIG. 2.

The upper thermal interface material layer 490 may cover top surfaces of the first, second, and third thermal pillars 250a, 250b, and 250c, the top surfaces of the first and second heat transfer films 460 and 470, and the top surface of the semiconductor chip 400.

Figure 20:
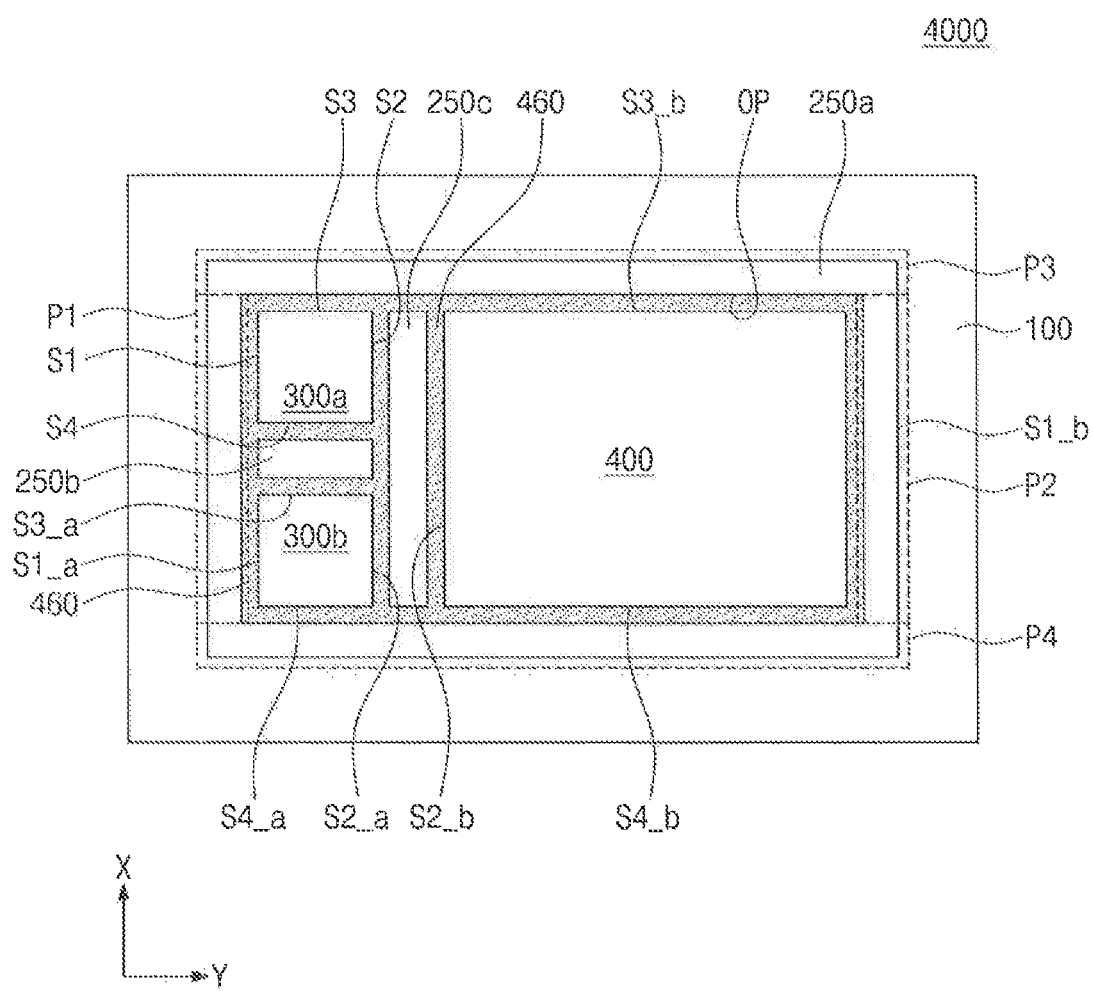
FIG. 20 is a plan view showing a semiconductor package according to an exemplary embodiment of the present inventive concept.

FIG. 20 is a plan view showing a semiconductor package according to an exemplary embodiment of the present inventive concept.

Referring to FIG. 20, a semiconductor package 4000 may include a first thermal pillar 250a having an opening OP, a second thermal pillar 250b, a third thermal pillar 250c, and a heat transfer film 460.

The first chip stack. 300a, the second chip stack 300b, and the semiconductor chip 400 may be disposed on the interposer substrate (see 200 of FIG. 2) in the opening OP of the first thermal pillar 250a. For example, the first chip stack 300a, the second chip stack 300b, and the semiconductor chip 400 may be disposed on the top surface of the interposer substrate 200. The second thermal pillar 250b may be disposed between the fourth lateral surface S4 of the first chip stack 300a and the third lateral surface S3_a of the second chip stack 300b. The third thermal pillar 250c may be disposed between the second lateral surface S2 of the first chip stack 300a and the second lateral surface S2_b of the semiconductor chip 400, between the second thermal pillar 250b and the second lateral surface S2_b of the semiconductor chip 400, and between the second lateral surface S2_a of the second chip stack 300b and the second lateral surface S2_b of the semiconductor chip 400.

In the opening OP of the first thermal pillar 250a, the heat transfer film 460 may surround the first to fourth lateral surfaces S1 to S4 of the first chip stack 300a, the first to fourth lateral surfaces S1_a to S4_a of the second chip stack 300b, the first to fourth lateral surfaces S1_b to S4_b of the semiconductor chip 400, lateral surfaces of the second and third thermal pillars 250b and 250c. For example, the first thermal pillar 250a may surround the heat transfer film 460, and inner surfaces of the first thermal pillar 250a may contact the heat transfer film 460. The heat transfer film 460 may be made of a single layer. However, the present inventive concept is not limited thereto; for example, the heat transfer film 460 may be made of a plurality of layers.

The semiconductor package 4000 might not include the air gap AG discussed with reference to FIG. 2.

Figure 21A:
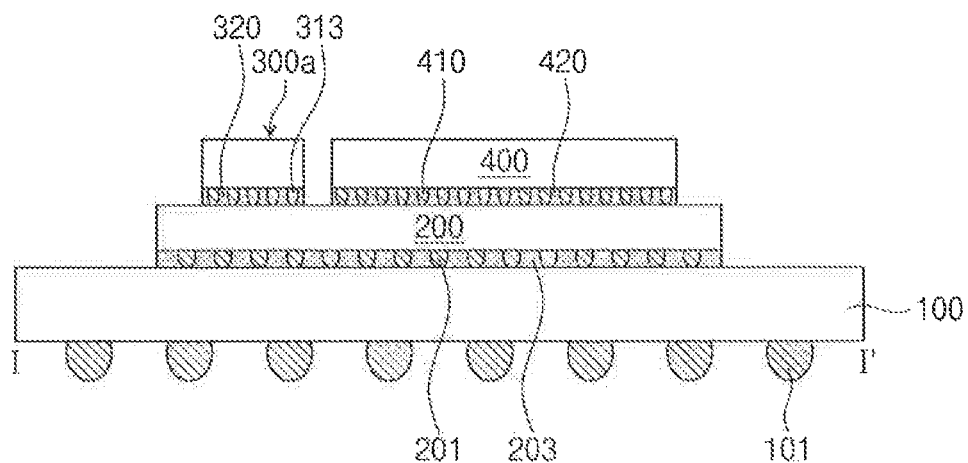
FIGS. 21A and 21B are cross-sectional views taken along lines I-I' of FIG. 1, showing a method of fabricating a semiconductor package according to an exemplary embodiment of the present inventive concept.
Figure 21B:
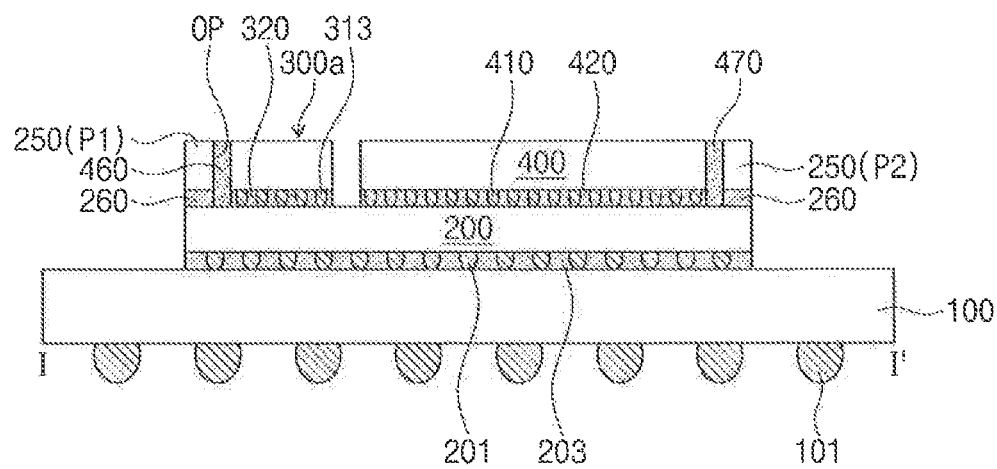

FIGS. 21A and 21B are cross-sectional views taken along lines I-I' of FIG. 1, showing a method of fabricating a semiconductor package according to an exemplary embodiment of the present inventive concept.

Referring to FIG. 21A, an interposer substrate 200 may be mounted on a package substrate 100. For example, the interposer substrate 200 may be mounted on a top surface of the package substrate 100. The mounting of the interposer substrate 200 on the top surface of the package substrate 100 may include aligning first terminals 201 on a bottom surface of the interposer substrate 200 with pads on the top surface of the package substrate 100. A technique such as screen printing, inkjet printing, or soldering may be used to form the first terminals 201 on the bottom surface of the interposer substrate 200. A first under-fill resin layer 203 may be formed in a space between the interposer substrate 200 and the package substrate 100. The first under-fill resin layer 203 may be formed by providing an under-fill resin solution to the space between the interposer substrate 200 and the package substrate 100 and then curing the under-fill resin solution. External terminals 101 may be formed on a bottom surface of the package substrate 100. A technique such as screen printing, inkjet printing, or soldering may be used to form the external terminals 101 on the bottom surface of the package substrate 100.

A first chip stack 300a, a second chip stack. (see 300b of FIG. 1), and a semiconductor chip 400 may be mounted on the interposer substrate 200. For example, the first chip stack 300a, a second chip stack (see 300b of FIG. 1), and a semiconductor chip 400 may be mounted on a top surface of the interposer substrate 200 that is opposite to the bottom surface of the interposer substrate 200. The mounting of the first and second chip stacks 300a and 300b on the top surface of the interposer substrate 200 may include aligning second terminals 313 on bottom surfaces of the first and second chip stacks 300a and 300b with pads on the top surface of the interposer substrate 200. The mounting of the semiconductor chip 400 on the top surface of the interposer substrate 200 may include aligning fourth terminals 410 on a bottom surface of the semiconductor chip 400 with pads on the top surface of the interposer substrate 200. A technique such as screen printing, inkjet printing, or soldering may be used to form the second terminals 313 on the bottom surfaces of the first and second chip stacks 300a and 300b. A technique such as screen printing, inkjet printing, or soldering may be used to form the fourth terminals 410 on the bottom surface of the semiconductor chip 400.

Second under-fill resin layers 320 may be formed in spaces between the top surface of the interposer substrate 200 and the bottom surface of the first chip stack 300a and between the top surface of the interposer substrate 200 and the bottom surface of the second chip stack 300b. The second under-fill resin layers 320 may be formed by providing an under-fill resin solution to the spaces between the top surface of the interposer substrate 200 and the bottom surface of the first chip stack 300a and between the top surface of the interposer substrate 200 and the bottom surface of the second chip stack 300b, and then curing the under-fill resin solution. A third under-fill resin layer 420 may be formed in a space between the top surface of the interposer substrate 200 and the bottom surface of the semiconductor chip 400. The third under-fill resin layer 420 may be formed by providing an under-fill resin solution to the space between the top surface of the interposer substrate 200 and the bottom surface of the semiconductor chip 400, and then curing the under-fill resin solution.

Referring to FIG. 21B, a thermal pillar 250 may be mounted on the top surface of the interposer substrate 200. The thermal pillar 250 may be formed to have an opening OP, and the semiconductor chip 400 and the first and second chip stacks 300a and 300b are disposed in the opening OP. A thermal interface material layer 260 may be attached to a bottom surface of the thermal pillar 250, and a first heat transfer film 460 may be attached to an inner surface of a first part P1 of the thermal pillar 250 and to a lateral surface of the thermal interface material layer 260 below the first part P1 of the thermal pillar 250. In addition, the inner surface of the first part P1 and lateral surface of the thermal interface material layer 260 are exposed by the opening OP. A second heat transfer film 470 may be attached to an inner surface of a second part P2 of the thermal pillar 250 and to a lateral surface of the thermal interface material layer 260 below the second part P2 of the thermal pillar 250. In addition, the inner surface of the second part P2 and lateral surface of the thermal interface material layer 260 are exposed by the opening OP.

The mounting of the thermal pillar 250 on the top surface of the interposer substrate 200 may include attaching the thermal interface material layer 260 to the top surface of the interposer substrate 200, attaching the first heat transfer film 460 to first lateral surfaces (see S1 and S1_a of FIG. 1) of the first and second chip stacks 300a and 300b and to lateral surfaces of the second under-fill resin layers 320, and attaching the second heat transfer film 470 to a first lateral surface (see S1_b of FIG. 1) of the semiconductor chip 400 and to a lateral surface of the third under-fill resin layer 420. The first and second heat transfer films 460 and 470 may fix the thermal pillar 250 on lateral surfaces of the first chip stack 300a, the second chip stack 300b, and the semiconductor chip 400. The thermal interface material layer 260 may fix the thermal pillar 250 on the top surface of the interposer substrate 200.

Referring back to FIG. 2, an upper thermal interface material layer 490 may be formed on top surfaces of the first and second chip stacks 300a and 300b and on a top surface of the semiconductor chip 400. The upper thermal interface material layer 490 may cover a top surface the thermal pillar 250 and top surfaces of the first and second heat transfer films 460 and 470. A heat slug 600 may be provided on a top surface of the upper thermal interface material layer 490. The heat slug 600 may cover the interposer substrate 200, the first and second chip stacks 300a and 300b, and the semiconductor chip 400, while contacting the top surface of the upper thermal interface material layer 490. An adhesive film 610 formed on bottom surfaces of end portions of the heat slug 600 may be attached to the top surface of the package substrate 100.

According to an exemplary embodiment of the present inventive concept, a thermal pillar may be disposed on a lateral surface of a first chip stack and on a lateral surface of a semiconductor chip. The first chip stack may be thermally coupled to the thermal pillar, and the semiconductor chip may also be thermally coupled to the thermal pillar. Heat generated from the first chip stack and the semiconductor chip may be outwardly radiated through the thermal pillar, and thus a semiconductor package may be provided to have increased heat radiation of the heat generated by the first chip stack and the semiconductor chip such that performance of the semiconductor package may be increased.

While the present inventive concept has been particularly shown and described with reference to exemplary embodiments thereof, it will be apparent to those of ordinary skill in the art that various changes in form and detail may be made thereto without departing from the spirit and scope of the present inventive concept.

What is claimed is:
1. A semiconductor package, comprising:
  a first thermal pillar disposed on a package substrate, and having an opening;
  a first chip stack disposed on the package substrate and in the opening of the first thermal pillar, and including a first lateral surface;
  a semiconductor chip disposed on the package substrate and in the opening, wherein the semiconductor chip is spaced apart from the first chip stack;
  a first heat transfer film disposed between the first thermal pillar and the first lateral surface of the first chip stack; and
  a second thermal pillar disposed between the first chip stack and the semiconductor chip, wherein the first chip stack, the semiconductor chip and the second thermal pillar are disposed at the same level.

2. The semiconductor package of claim 1, wherein
the semiconductor chip includes a second lateral surface extending parallel to the first lateral surface of the first chip stack and adjacent to the first thermal pillar, and
the semiconductor package further comprises a second heat transfer film disposed between the first thermal pillar and the second lateral surface of the semiconductor chip.

3. The semiconductor package of claim 2, wherein
the first chip stack further includes a third lateral surface parallel to the first lateral surface,
the semiconductor chip further includes a fourth lateral surface parallel to the second lateral surface, and
the third lateral surface of the first chip stack and the fourth lateral surface of the semiconductor chip are exposed by the first and second heat transfer films.

4. The semiconductor package of claim 1, further comprising:
an upper thermal interface material layer disposed on the first chip stack, the semiconductor chip, and the first thermal pillar; and
an air gap disposed between the upper thermal interface material layer, the first chip stack and the semiconductor chip,
wherein the air gap is a space filled with air.

5. The semiconductor package of claim 1, further comprising a second chip stack disposed on the package substrate and in the opening, wherein
the first chip stack and the second chip stack are spaced apart from each other in a first direction,
the first chip stack is spaced apart from the semiconductor chip in a second direction intersecting the first direction,
the second chip stack includes a second lateral surface extending in a same direction as the first lateral surface of the first chip stack, and
the first heat transfer film intermediately extends between the first thermal pillar and the second lateral surface of the second chip stack.

6. The semiconductor package of claim 1, further comprising a second chip stack disposed on the package substrate and in the opening, wherein
the first chip stack and the second chip stack are spaced apart from each other in a first direction,
the first chip stack is spaced apart from the semiconductor chip in a second direction intersecting the first direction, and
the first heat transfer film intermediately extends between the first chip stack and the second chip stack.

7. The semiconductor package of claim 1, wherein
the semiconductor chip includes a second lateral surface adjacent to the first thermal pillar and extending parallel to the first lateral surface of the first chip stack, and
the first heat transfer film extends between the first thermal pillar and the second lateral surface of the semiconductor chip.

8. The semiconductor package of claim 1, wherein
the first chip stack further includes a second lateral surface and a third lateral surface extending in a first direction intersecting a second direction,
the first lateral surface extends in the second direction,
the second and third lateral surfaces are parallel to each other,
the first lateral surface is closer to the first thermal pillar than to the semiconductor chip,
the semiconductor chip includes a fourth lateral surface, a fifth lateral surface, and a sixth lateral surface, wherein the fourth lateral surface extends in a same direction as the first lateral surface, wherein the fifth lateral surface and the sixth lateral surface extend in a same direction as the second lateral surface and the third lateral surface of the first chip stack,
the fourth lateral surface is closer to the first thermal pillar than to the first chip stack, and
the first heat transfer film intermediately extends between the first thermal pillar and the second and third lateral surface of the first chip stack and between the first thermal pillar and the fifth and sixth lateral surfaces of the semiconductor chip.

9. The semiconductor package of claim 1, wherein
the first heat transfer film fills a space in the opening of the first thermal pillar,
the first chip stack further includes a second lateral surface parallel to the first lateral surface, a third lateral surface intersecting the first and second lateral surfaces, and a fourth lateral surface parallel to the third lateral surface,
the semiconductor chip includes a fifth lateral surface and a sixth lateral surfaces which extend in a same direction as the first lateral surface and the second lateral surface of the first chip stack, and a seventh lateral surface and an eight lateral surface which extend in a same direction as the third lateral surface and the fourth lateral surface of the first chip stack, and
the first heat transfer film surrounds the first to fourth lateral surfaces of the first chip stack and the fifth to eighth lateral surfaces of the semiconductor chip.

10. The semiconductor package of claim 1, wherein the second thermal pillar is spaced apart from the first thermal pillar.

11. A semiconductor package, comprising:
a first chip stack disposed on a package substrate, and including a first lateral surface and a second lateral surface;
a semiconductor chip disposed on the package substrate and spaced apart from the first chip stack, wherein the semiconductor chip includes a third lateral surface and a fourth lateral surface;
a first thermal pillar disposed on the first lateral surface of the first chip stack;
a first heat transfer film disposed between the first thermal pillar and the first lateral surface of the first chip stack;
a second thermal pillar disposed on the third lateral surface of the semiconductor chip; and
a second heat transfer film disposed between the second thermal pillar and the third lateral surface of the semiconductor chip,
wherein the second lateral surface of the first chip stack and the fourth lateral surface of the semiconductor chip are exposed by the first and second heat transfer films,
wherein each of the first and second thermal pillars includes:
a horizontal segment parallel to the package substrate; and
a vertical segment which extends from an end portion of the horizontal segment toward a top surface of the package substrate, wherein a top surface of the horizontal segment and a top surface of the first chip stack are coplanar.

12. The semiconductor package of claim 11, wherein the second lateral surface of the first chip stack and the fourth lateral surface of the semiconductor chip are adjacent to each other.

13. The semiconductor package of claim 11, further comprising a thermal interface material layer disposed between the first thermal pillar and the package substrate and between the second thermal pillar and the package substrate.

14. The semiconductor package of claim 11, wherein a bottom surface of the horizontal segment is exposed by the first heat transfer film.

15. The semiconductor package of claim 11, wherein
the first lateral surface of the first chip stack faces the third lateral surface of the semiconductor chip, and
the second thermal pillar is disposed between the first chip stack and the semiconductor chip.

16. The semiconductor package of claim 11, further comprising
an interposer substrate disposed between the package substrate and the first chip stack and between the package substrate and the semiconductor chip; and
a thermal interface material layer disposed between a bottom surface of the first thermal pillar and a top surface of the interposer substrate and between a bottom surface of the second thermal pillar and the top surface of the interposer substrate.

17. The semiconductor package of claim 11, further comprising an interposer substrate disposed between the package substrate and the first chip stack and between the package substrate and the semiconductor chip,
wherein
the horizontal segment of the first thermal pillar is disposed on a top surface of the interposer substrate,
the vertical segment of the first thermal pillar is in contact with a first lateral surface of the interposer substrate,
the horizontal segment of the second thermal pillar is disposed on the top surface of the interposer substrate, and
the vertical segment of the second thermal pillar is in contact with a second lateral surface of the interposer substrate, wherein the second lateral surface of the interposer substrate is opposite to the first lateral surface of the interposer substrate.

18. The semiconductor package of claim 11, further comprising:
an upper thermal interface material layer disposed on the top surface of the first chip stack and a top surface of the semiconductor chip; and
an air gap between the second lateral surface of the first chip stack and the fourth lateral surface of the semiconductor chip, wherein the air gap is covered with the upper thermal interface material layer,
wherein the air gap is filled with air.

19. The semiconductor package of claim 11, further comprising:
an upper thermal interface material layer disposed on the top surface of the first chip stack and a top surface of the semiconductor chip; and
a heat slug disposed on the upper thermal interface material layer, wherein the heat slug surrounds the first chip stack and the semiconductor chip,
wherein the upper thermal interface material layer is in contact with a top surface of the first thermal pillar and a top surface of the second thermal pillar.

20. The semiconductor package of claim 11, wherein the first and second heat transfer films are in contact with a top surface of the package substrate.

* * * * *